(12) United States Patent
Chiu et al.

(10) Patent No.: US 9,768,139 B2
(45) Date of Patent: Sep. 19, 2017

(54) SEMICONDUCTOR DEVICE AND SEMICONDUCTOR PACKAGE

(71) Applicant: Advanced Semiconductor Engineering, Inc., Kaosiung (TW)

(72) Inventors: Wan-Ting Chiu, Kaohsiung (TW); Chien-Fan Chen, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 15/297,691

(22) Filed: Oct. 19, 2016

(65) Prior Publication Data

US 2017/0040279 A1    Feb. 9, 2017

Related U.S. Application Data

(63) Continuation of application No. 14/691,448, filed on Apr. 20, 2015, now Pat. No. 9,508,671.

(51) Int. Cl.
*H01L 23/40* (2006.01)
*H01L 23/52* (2006.01)
(Continued)

(52) U.S. Cl.
CPC ............ *H01L 24/17* (2013.01); *H01L 23/293* (2013.01); *H01L 23/3157* (2013.01);
(Continued)

(58) Field of Classification Search
USPC ................ 257/664–677, 734–786, 257/E29.111–E29.165, E23.01–E23.079,
(Continued)

(56) References Cited

U.S. PATENT DOCUMENTS

| | | | |
|---|---|---|---|
| 6,861,749 B2 | 3/2005 | Wu et al. | |
| 7,173,828 B2 | 2/2007 | Lin et al. | |
| 7,462,942 B2 | 12/2008 | Tan et al. | |
| 7,855,397 B2* | 12/2010 | Alley | H01L 23/38 136/203 |
| 8,067,308 B2 | 11/2011 | Suthiwongsunthorn et al. | |
| 8,207,608 B2 | 6/2012 | Chew et al. | |
| 8,757,474 B2* | 6/2014 | Abe | B23K 1/0016 228/180.21 |
| 2008/0088013 A1 | 4/2008 | Chew et al. | |
| 2011/0003470 A1 | 1/2011 | Burgess et al. | |
| 2011/0084381 A1 | 4/2011 | Lo et al. | |
| 2011/0084389 A1 | 4/2011 | Lo et al. | |
| 2011/0195544 A1* | 8/2011 | Bachman | H01L 24/03 438/108 |
| 2011/0260316 A1 | 10/2011 | Jang et al. | |

(Continued)

FOREIGN PATENT DOCUMENTS

| CN | 102361028 A | 2/2012 |
|---|---|---|
| CN | 102593088 A | 7/2012 |

OTHER PUBLICATIONS

Notice of Allowance for U.S. Appl. No. 14/691,448, dated Aug. 1, 2016.

(Continued)

*Primary Examiner* — Tram H Nguyen
(74) *Attorney, Agent, or Firm* — Foley & Lardner LLP; Cliff Z. Liu

(57) ABSTRACT

The present disclosure relates to bonding structures useful in semiconductor packages. In an embodiment, a semiconductor device includes a semiconductor element, two pillar structures, and an insulation layer. The semiconductor element has a surface and includes at least one bonding pad disposed adjacent to the surface. The two pillar structures are disposed on a single bonding pad. The insulation layer is disposed adjacent to the surface of the semiconductor element. The insulation layer defines an opening, the opening exposes a portion of the single bonding pad, and the two pillar structures are disposed in the opening.

21 Claims, 27 Drawing Sheets

(51) Int. Cl.
    *H01L 29/40*     (2006.01)
    *H01L 23/00*     (2006.01)
    *H01L 23/31*     (2006.01)
    *H01L 23/29*     (2006.01)

(52) U.S. Cl.
    CPC .......... *H01L 23/3171* (2013.01); *H01L 24/05* (2013.01); *H01L 24/08* (2013.01); *H01L 24/13* (2013.01); *H01L 24/14* (2013.01); *H01L 23/562* (2013.01); *H01L 2224/022* (2013.01); *H01L 2224/0401* (2013.01); *H01L 2224/05552* (2013.01); *H01L 2224/13014* (2013.01); *H01L 2224/13016* (2013.01); *H01L 2224/13023* (2013.01); *H01L 2224/1411* (2013.01); *H01L 2224/17107* (2013.01); *H01L 2225/06513* (2013.01); *H01L 2924/07025* (2013.01); *H01L 2924/35* (2013.01)

(58) Field of Classification Search
    USPC ........ 257/E233141–E23.179, 41, 81, 82, 91, 257/99, 177–182, 276, 457, 459, 502, 257/503, 602, 621, 688–700; 438/571, 438/83, 98, 100, 101, 111, 112, 123, 124, 438/411, 412, 461, 584, 597–688, 455, 438/108; 228/180.22
    See application file for complete search history.

(56) References Cited

U.S. PATENT DOCUMENTS

| | | |
|---|---|---|
| 2012/0286418 A1 | 11/2012 | Lee et al. |
| 2013/0062755 A1 | 3/2013 | Kuo et al. |
| 2013/0099371 A1 | 4/2013 | Cheng et al. |
| 2014/0332953 A1* | 11/2014 | Ossimitz ........... H01L 23/49827 257/737 |
| 2015/0014848 A1* | 1/2015 | Lin .................. H01L 24/81 257/737 |
| 2015/0140738 A1* | 5/2015 | Moriyama ............ H01L 24/29 438/113 |

OTHER PUBLICATIONS

Non-Final Office Action for U.S. Appl. No. 14/691,448, dated Mar. 16, 2016.
Search Report for Taiwan Patent Application No. 105112033, dated Nov. 24, 2016.

* cited by examiner

SEMICONDUCTOR DEVICE AND SEMICONDUCTOR PACKAGE

CROSS REFERENCE TO RELATED APPLICATIONS

This application is a continuation of U.S. patent application Ser. No. 14/691,448, filed Apr. 20, 2015, the content of which is incorporated herein by reference in its entirety.

BACKGROUND

1. Technical Field

The present disclosure relates to a semiconductor device and a semiconductor package, and, more particularly, to a semiconductor device and a semiconductor package including two pillar structures disposed on a single bonding pad.

2. Description of the Related Art

In a semiconductor flip-chip bonding process, an upper chip is placed on a lower chip (or a substrate). The upper chip may be electrically connected to the lower chip (or substrate) through metal pillars disposed on the upper chip, and through lower bonding pads disposed on the lower chip. Solder may be used to physically connect the metal pillar and the lower ponding pad.

SUMMARY

One aspect of the present disclosure relates to a semiconductor device. In an embodiment, the semiconductor device includes a semiconductor element and two pillar structures. The semiconductor element has a surface and includes at least one bonding pad disposed adjacent to the surface. The two pillar structures are disposed on the one bonding pad. The two pillar structures are symmetric and formed of a same material.

Another aspect of the present disclosure relates to a semiconductor package. In an embodiment, the semiconductor package comprises a semiconductor element, two pillar structures, and a substrate. The semiconductor element includes a first surface and at least one bonding pad disposed adjacent to the first surface. The two pillar structures are disposed on the one bonding pad. The substrate includes a second surface and at least one trace disposed adjacent to the second surface, wherein the two pillar structures are bonded to the trace.

Another aspect of the present disclosure relates to a semiconductor package. In an embodiment, the semiconductor package comprises a chip, an organic insulating layer, two conductive column structures, and a substrate. The chip includes an active surface and at least one contact pad disposed on the active surface. The organic insulating layer is disposed on the active surface of the chip and defines two openings, each opening exposing a portion of the contact pad. The two conductive column structures are formed on the organic insulating layer, and each of the two conductive column structures is disposed within a respective one of the two openings and is connected to the contact pad. The substrate includes a substrate surface facing the active surface of the chip. The substrate further includes at least one trace disposed on the substrate surface, wherein the two conductive column structures are bonded to one of the at least one trace.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are specified with respect to a certain component or certain plane of a component, as described in the specification and shown in the figures. Furthermore, it should be understood that the spatial descriptions used herein are for purposes of illustration only, and that practical implementations of the structures described herein can be spatially arranged in any orientation or manner, provided that the merits of embodiments of this disclosure are not deviated by such arrangement.

In a semiconductor flip-chip bonding process, an upper chip is placed on a lower chip (or a substrate). The upper chip may be electrically connected to the lower chip (or to a substrate) through metal pillars disposed on the upper chip and through lower bonding pads disposed on the lower chip. Solder is disposed to connect the metal pillar and the lower bonding pad. A reflow process melts the solder so that the metal pillar can bond with the bonding pad, to form a flip-chip bonding structure. However, such bonding structure can be fragile, as stress is often generated at the peripheral bottom portion of the metal pillar, which may break the metal pillar or a solder connection, and may further affect the electrical connection; additionally, if the metal pillar is formed on a passivation layer of the upper chip, the bonding structure may be more fragile. A result may be low reliability. The semiconductor device of the present disclosure provides for an improved bonding structure with reduced fragility.

Figure 1A:
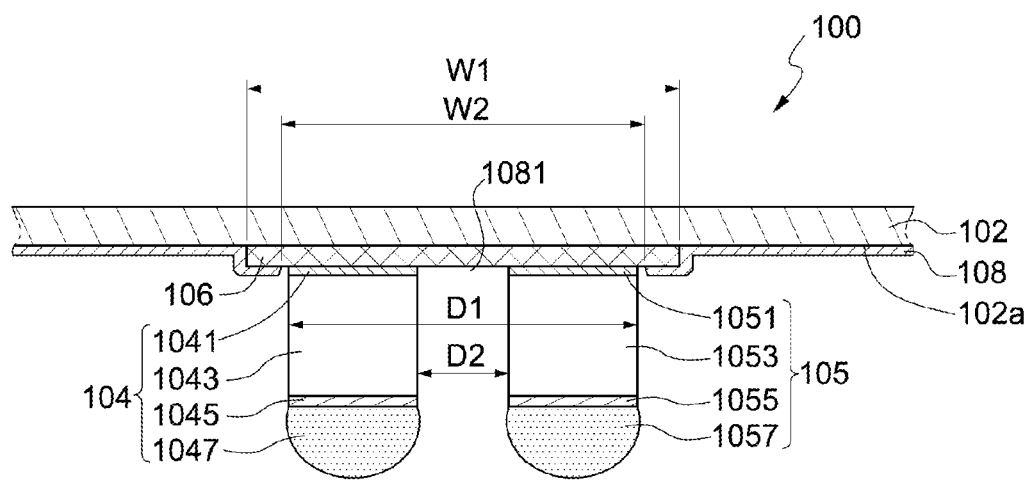
FIG. 1(a) illustrates a cross-sectional view of a semiconductor device according to an embodiment of the present disclosure.

FIG. 1(a) illustrates a cross-sectional view of a semiconductor device 100 according to an embodiment of the present disclosure. The semiconductor device 100 of FIG. 1(a) comprises a semiconductor element 102, multiple pillar structures including two pillar structures 104, 105, and a first insulation layer 108.

The semiconductor element 102 may be a chip, a package, or an interposer. The semiconductor element 102 has a first surface 102a and one or more bonding pads 106. In this embodiment, the first surface 102a is an active surface, and the bonding pad 106 is a contact pad. The bonding pad 106 (contact pad) is disposed adjacent to the first surface 102a (active surface) of the semiconductor element 102. In this embodiment, the bonding pad 106 is disposed on the first surface 102a of the semiconductor element 102. The material of the bonding pad 106 may comprise, for example, one of, or a combination of, copper, gold, indium, tin, silver, palladium, osmium, iridium, ruthenium, titanium, magnesium, aluminum, cobalt, nickel, or zinc, or other metals or metal alloys. The bonding pad 106 has a maximum width of W1.

The first insulation layer 108 is disposed adjacent to the first surface 102a of the semiconductor element 102. In this embodiment, the first insulation layer 108 is disposed on the first surface 102a of the semiconductor element 102 to cover a portion of each of the bonding pad 106 and the first surface 102a of the semiconductor element 102. The first insulation layer 108 has one or more openings 1081. Each opening 1081 corresponds to a respective bonding pad 106 and exposes at least a portion of the bonding pad 106. The first insulation layer 108 may be a passivation layer (the material of which may be silicon oxide or silicon nitride, or another insulation material). The opening 1081 has a maximum width W2.

The two pillar structures 104, 105 are conductive column structures. Both pillar structures 104, 105 illustrated in FIG. 1(a) are disposed within the illustrated opening 1081 and are directly disposed on the exposed portion of the illustrated bonding pad 106. As seen in FIG. 1(a), both pillar structures 104, 105 are disposed on one bonding pad 106, and are spaced apart from each other by a gap D2. Pillar structure 104 includes an under bump metallization (UBM) layer 1041, a pillar 1043, a barrier layer 1045, and a solder layer 1047; pillar structure 105 includes a UBM layer 1051, a pillar 1053, a barrier layer 1055, and a solder layer 1057. In some embodiments, the barrier layers 1045, 1055 and the solder layers 1047, 1057 are omitted from the pillar structures 104, 105. In the embodiment illustrated in FIG. 1(a), the two pillar structures 104, 105 are symmetric to each other, such as having mirror symmetry with respect to a center axis or plane of the bonding pad 106; symmetry of the pillar structures 104, 105 can be in terms of having corresponding or matching shapes, within manufacturing tolerances, having corresponding or matching sizes, within manufacturing tolerances, or both. In other embodiments, the two pillar structures 104, 105 may be different in structure. Further, in the embodiment illustrated in FIG. 1(a), the two pillar structures 104, 105 are positioned at similar positions on opposite sides of the bonding pad 106 (e.g., positioned symmetrically on the bonding pad 106 with respect to a center axis or plane of the bonding pad 106); however, such positioning symmetry is not present in other embodiments. The two pillar structures 104, 105 are disposed fully inside the space defined by the perimeter of the respective opening 1081 of the first insulating layer 108.

The two UBM layers 1041, 1051 are disposed in the opening 1081 of the first insulation layer 108 and contact the bonding pad 106. The two UBM layers 1041 and 1051 are spaced apart from each other and do not contact each other. In an embodiment, the UBM layers 1041,1051 may be formed from a metal, metal alloy, multi-metal or multi-alloy stack, such as a multi-alloy stack including, for example, a combination of copper, nickel, titanium, vanadium, chromium, and gold.

The two pillars 1043, 1053 are disposed on the two respective UBM layers 1041, 1051 and are electrically connected to the bonding pad 106. The shape of each of the pillars 1043, 1053 from a top view may be a shape of a gibbous moon, a semiellipse, a circle, or a square. In an embodiment, the material of the two pillars 1043, 1053 comprises copper.

The two barrier layers 1045, 1055 are formed on the respective two pillars 1043, 1053; and the two solder layers 1047, 1057 are formed on the respective two barrier layers 1045, 1055. The two barrier layers 1045, 1055 block metal diffusion (such as copper diffusion) from the respective two pillars 1043, 1053 to the respective two solder layers 1047, 1057. Without the two barrier layers 1045, 1055, a thick intermetallic compound (IMC) may form at an interface between the respective two solder layers 1047, 1057 and the respective two pillars 1043, 1053 due to an abundant metal source from the pillars 1043, 1053. As a result, the strength of the two pillar structures 104, 105 will be weak, and the adhesion will be poor. The material of the two barrier layers 1045, 1055 may comprise, for example, one of, or a combination of, nickel (Ni), nickel phosphorous alloy (NiP) or nickel vanadium alloy (NiV). The material of the two solder layers 1047, 1057 may comprise, for example, one of tin (Sn), silver (Ag), lead (Pb), Zinc (Zn), copper (Cu), bismuth (Bi), indium (In), or antimony (Sb), or an alloy thereof, such as SnAg, Sn—Pb, SnAgCu, SnAgZn, SnZn, SnBi—In, Sn—In, Sn—Au, SnPb, SnCu, SnZnIn, or SnAgSb.

Referring still to FIG. 1(a), and identifying the two pillar structures 104, 105 as a left pillar structure 104 and a right pillar structure 105, respectively, for the following discussion, a distance D1 and the distance D2 are defined with respect to the left pillar structure 104 and the right pillar structure 105. Distance D1 is a maximum distance between a leftmost portion of a left pillar 1043 of the left pillar structure 104 to a rightmost portion of a right pillar 1053 of the right pillar structure 105, and the gap D2 is defined as a distance between a rightmost portion of the left pillar 1043 of the left pillar structure 104 to a leftmost portion of the right pillar 1053 of the right pillar structure 105. In addition, there may be space between the leftmost portion of the left pillar 1043 of the left pillar structure 104 and an edge of the opening 1081, and there may be a space between the rightmost portion of the right pillar 1053 of the right pillar structure 105 and an edge of the opening 1081. That is, the two pillar structures 104, 105 do not contact the first insulation layer 108 in some embodiments.

In the embodiment illustrated in FIG. 1(a), the maximum distance D1 is less than the maximum width W1 of the bonding pad 106, and is also less than the maximum width W2 of the opening 1081. The gap D2 is from about 10 μm to about 30 μm, such as from about 10 μm to about 20 μm.

In the embodiment illustrated in FIG. 1(a), the two pillar structures 104, 105 are arranged on one bonding pad 106; thus, after flip-chip bonding, a stress generated at a peripheral bottom portion of either of the two pillar structures 104, 105 is reduced as compared with a single pillar structure (e.g., as compared to a single pillar structure having a width of about distance D1), because a width of each of the two pillar structures 104, 105 individually is relatively small as compared with a width of such a single pillar structure disposed on a single bonding pad. Therefore, by comparison to the single pillar structure, a risk of breaking either of the two pillar structures 104, 105, or breaking a solder connection, is reduced. As a result, the reliability is improved. More generally in some embodiments, two or more pillar structures, such as two, three, four, or more, may be disposed on one bonding pad to attain the benefits of improved reliability.

Figure 1B:
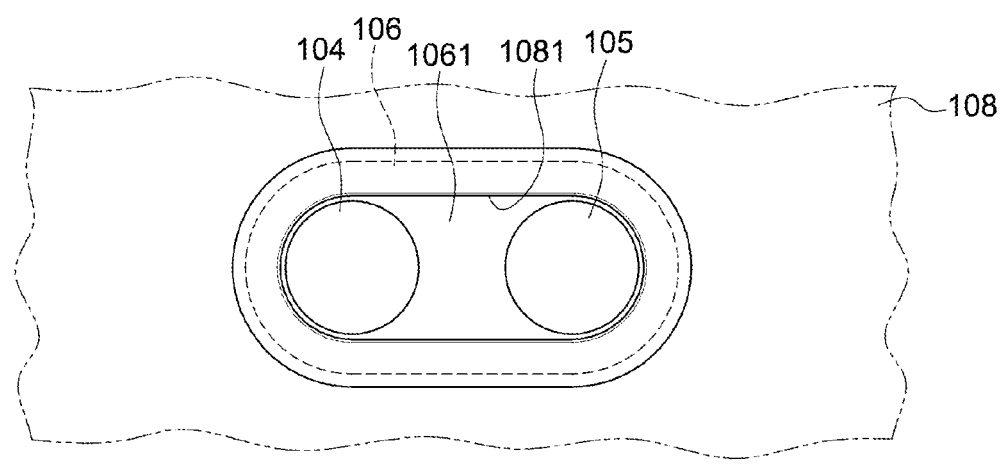
FIG. 1(b) illustrates a bottom view of the semiconductor device illustrated in FIG. 1(a).

FIG. 1(b) illustrates a bottom view of an embodiment of the semiconductor device 100 illustrated in FIG. 1(a). The opening 1081 exposes a portion 1061 of the bonding pad 106, and exposes the two pillar structures 104, 105. In addition, there may be space between the leftmost portion of the left pillar structure 104 and an edge of the opening 1081, and between the rightmost portion of the right pillar structure 105 and an edge of the opening 1081. In the embodiment of FIG. 1(b), the shape of the respective pillar structures 104, 105 is a circle.

Figure 2A:
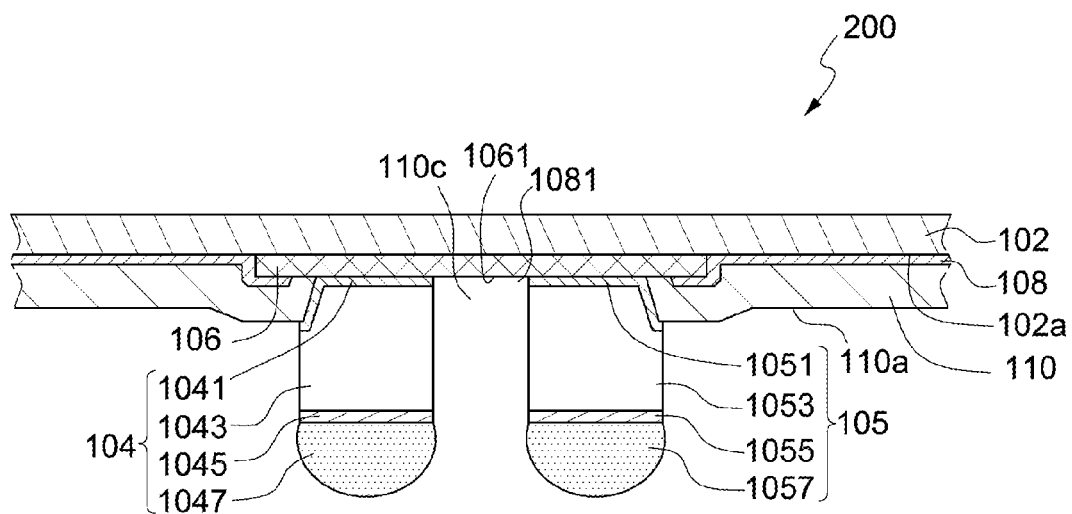
FIG. 2(a) illustrates a cross-sectional view of a semiconductor device according to another embodiment of the present disclosure.

FIG. 2(a) illustrates a cross-sectional view of a semiconductor device 200 according to another embodiment of the present disclosure. The semiconductor device 200 of this embodiment is similar to the semiconductor device 100 illustrated in FIG. 1(a), except that a second insulation layer 110 is disposed adjacent to the first surface 102a of the semiconductor element 102. In this embodiment, the second insulation layer 110 covers the first insulation layer 108 and a portion of the bonding pad 106. The second insulation layer 110 has one or more openings 110c. Each opening 110c corresponds to a respective bonding pad 106 and exposes at least a portion of the respective bonding pad 106. The second insulation layer 110 may be an organic insulating layer, the material of which is, for example, polyimide (PI) or other polymer.

The two pillar structures 104, 105 are disposed in a respective opening 110c, on the exposed portion of the a single respective bonding pad 106. A portion of each of the two pillar structures 104, 105 extends beyond the respective opening 110c such that the two pillar structures 104, 105 contact and may extend onto the second insulation layer 110. That is, a portion of each of the two UBM layers 1041, 1051 is in contact with the second insulation layer 110, and may extend onto a surface 110a of the second insulation layer 110, as illustrated in FIG. 2(a). Correspondingly, a portion of the two pillars 1043, 1053, a portion of the two barrier layers 1045, 1055, and a portion of the two solder layers 1047, 1057 are positioned over portions of the second insulation layer 110. Nevertheless, as described for FIG. 1(a), the two pillar structures 104, 105 are still disposed fully inside the space defined by the perimeter of the respective opening 1081 in the first insulating layer 108.

In the embodiment illustrated in FIG. 2(a), after flip-chip bonding, a stress generated at a peripheral bottom portion of each of the two pillar structures 104, 105 is further reduced because the second insulation layer 110 absorbs a portion of the stress. Therefore, a risk of breaking either of the two pillar structures 104, 105, or breaking a solder connection, is further reduced. As a result, the reliability is further improved.

Figure 2B:
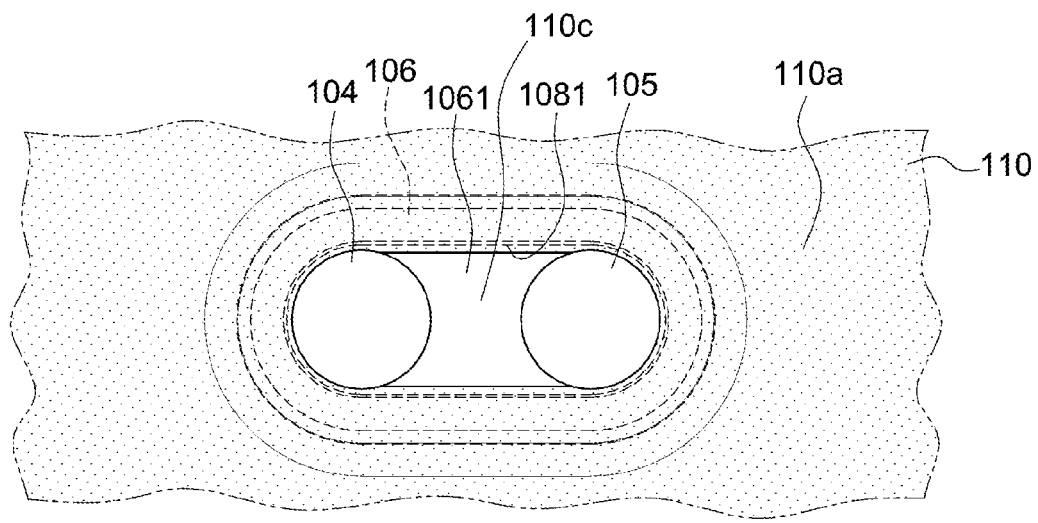
FIG. 2(b) illustrates a bottom view of the semiconductor device illustrated in FIG. 2(a).

FIG. 2(b) illustrates a bottom view of an embodiment of the semiconductor device 200 illustrated in FIG. 2(a). The opening 110c exposes the portion 1061 of the bonding pad 106 and the two pillar structures 104, 105 (e.g., left pillar structure 104 and right pillar structure 105). In addition, a leftmost portion of the left pillar structure 104 and a rightmost portion of the right pillar structure 105 are disposed over the surface 110a of the second insulation layer 110.

Figure 3A:
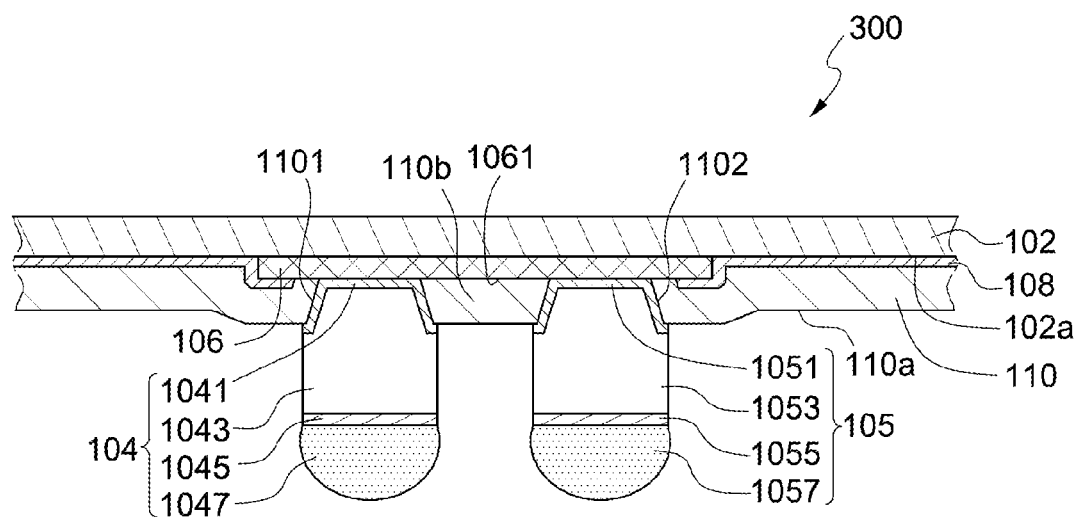
FIG. 3(a) illustrates a cross-sectional view of a semiconductor device according to another embodiment of the present disclosure.

FIG. 3(a) illustrates a cross-sectional view of a semiconductor device 300 according to another embodiment of the present disclosure. The semiconductor device 300 of this embodiment is similar to the semiconductor device 200 illustrated in FIG. 2(a), except that the second insulation layer 110 is further disposed between the two pillar structures 104, 105, shown as portion 110b of the second insulation layer 110, and the second insulation layer 110 includes two openings 1101, 1102 corresponding to a single bonding pad 106 (e.g., rather than one opening 110c as illustrated for the embodiment of FIG. 2(a)). Each opening 1101, 1102 exposes a portion of the respective bonding pad 106. The two pillar structures 104, 105 are disposed in respective openings 1101, 1102, on respective exposed portions of the respective bonding pad 106. That is, the two pillar structures 104, 105 are directly connected to the bonding pad 106 within the openings 1101, 1102. A portion of each of the two pillar structures 104, 105 extends beyond the respective openings 1101, 1102 such that the two pillar structures 104, 105 contact and may extend onto the second insulation layer 110. That is, a portion of each of the two UBM layers 1041, 1051 is in contact with the second insulation layer 110, and may extend onto the surface 110a of the second insulation layer 110, including on the surface 110a over the portion 110b of the second insulation layer 110 as illustrated in FIG. 3(a). Correspondingly, a portion of the two pillars 1043, 1053, a portion of the two barrier layers 1045, 1055, and a portion of the two solder layers 1047, 1057 are positioned over portions of the second insulation layer 110. As described for FIG. 2(a), the two pillar structures 104, 105 are still disposed fully inside the space defined by the perimeter of the respective opening 1081 of the first insulating layer 108.

In the embodiment illustrated in FIG. 3(a), after flip-chip bonding, a stress generated at a peripheral bottom portion of the pillar structures 104, 105 is further reduced because the second insulation layer 110 absorbs more of the stress. Therefore, a risk of breaking either of the two pillar structures 104, 105, or breaking a solder connection, is further reduced. As a result, the reliability is further improved.

Figure 3B:
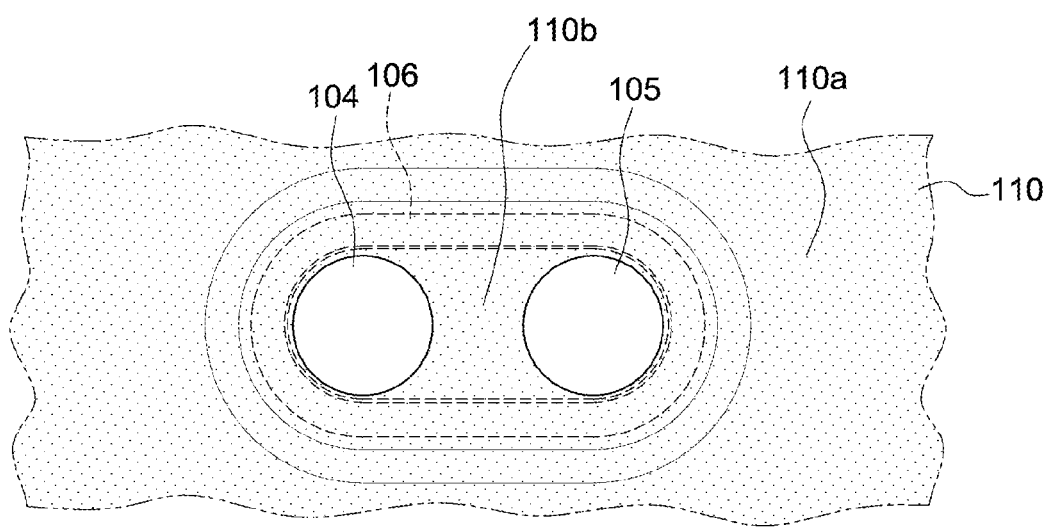
FIG. 3(b) illustrates a bottom view of the semiconductor device illustrated in FIG. 3(a).

FIG. 3(b) illustrates a bottom view of an embodiment of the semiconductor device 300 illustrated in FIG. 3(a). The second insulation layer 110 has two or more openings 1101, 1102 above the single bonding pad 106. From the bottom view of the semiconductor device 300, it can be seen that, in this embodiment, the bonding pad 106 is not exposed by the second insulation layer 110.

Figure 4A:
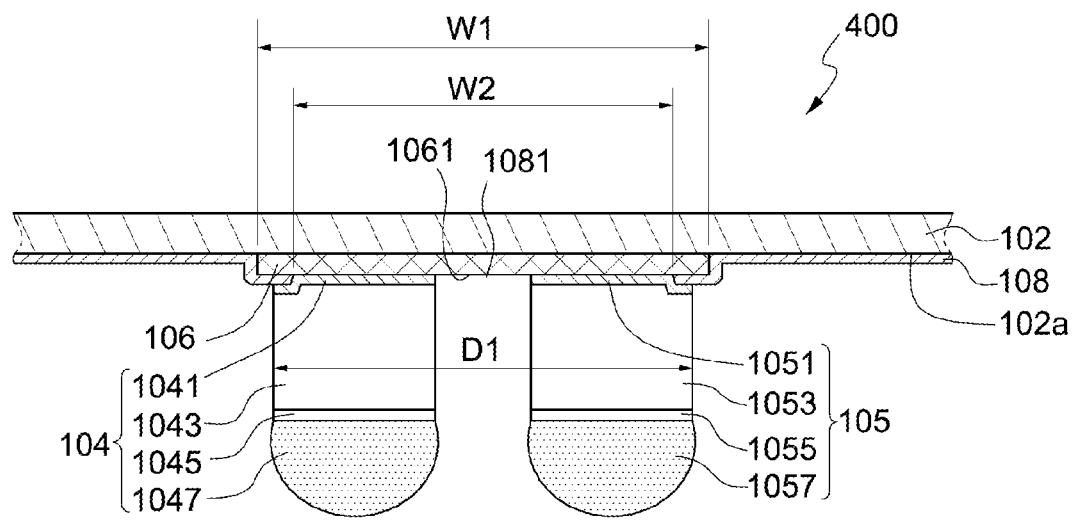
FIG. 4(a) illustrates a cross-sectional view of a semiconductor device according to another embodiment of the present disclosure.

FIG. 4(a) illustrates a cross-sectional view of a semiconductor device 400 according to another embodiment of the present disclosure. The semiconductor device 400 of this embodiment is similar to the semiconductor device 100 illustrated in FIG. 1(a), except that the two pillar structures 104, 105 extend beyond the space defined by the perimeter of the respective opening 1081 of the first insulation layer 108, such that the two pillar structures 104, 105 contact and may extend onto the first insulation layer 108. That is, a portion of each of the two UBM layers 1041, 1051 is in contact with the first insulation layer 108, and may extend onto the first insulation layer 108. Correspondingly, a portion of the two pillars 1043, 1053, a portion of the two barrier layers 1045, 1055, and a portion of the two solder layers 1047, 1057 are positioned over portions of the first insulation layer 108. In this embodiment, the distance D1 is greater than the width W2 of the opening 1081, and is less than the width W1 of the bonding pad 106.

Figure 4B:
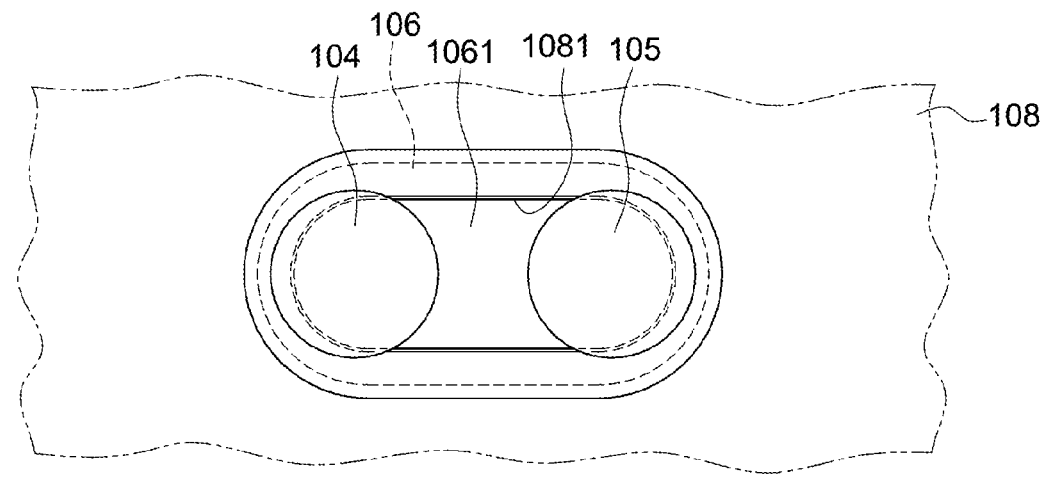
FIG. 4(b) illustrates a bottom view of the semiconductor device 400 illustrated in FIG. 4(a).

FIG. 4(b) illustrates a bottom view of an embodiment of the semiconductor device 400 illustrated in FIG. 4(a). The opening 1081 exposes a portion 1061 of the bonding pad 106 and the two pillar structures 104, 105. In this embodiment, the shape of the respective pillar structures 104, 105 is a circle.

Figure 5A:
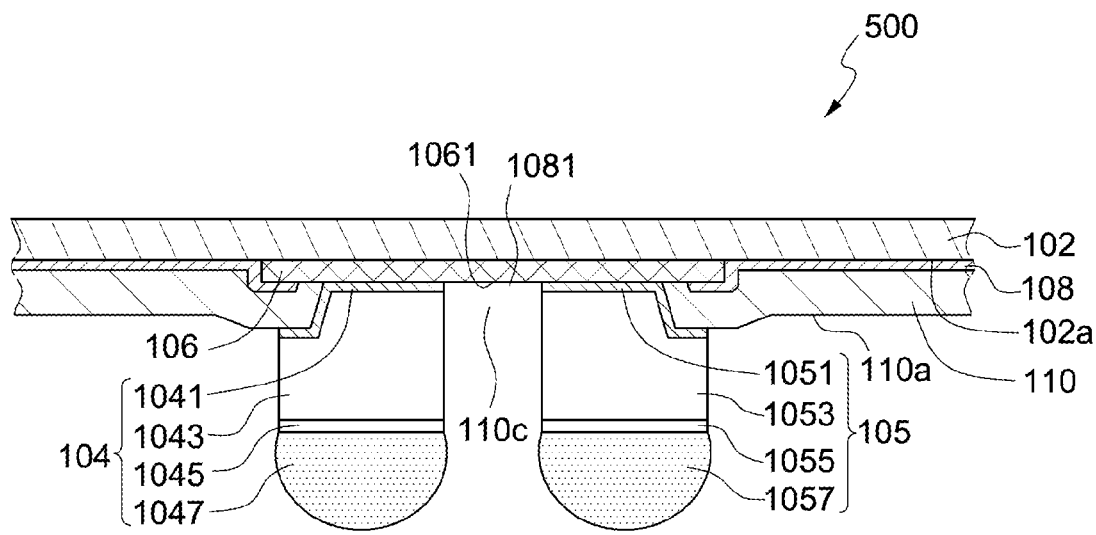
FIG. 5(a) illustrates a cross-sectional view of a semiconductor device according to another embodiment of the present disclosure.

FIG. 5(a) illustrates a cross-sectional view of a semiconductor device 500 according to another embodiment of the present disclosure. The semiconductor device 500 of this embodiment is similar to the semiconductor device 200 illustrated in FIG. 2(a), except that the two pillar structures 104, 105 extend beyond the space defined by the perimeter of the respective opening 1081 of the first insulation layer 108, instead of being fully inside the space defined by the perimeter of the respective opening 1081 as described for FIG. 2(a).

Figure 5B:
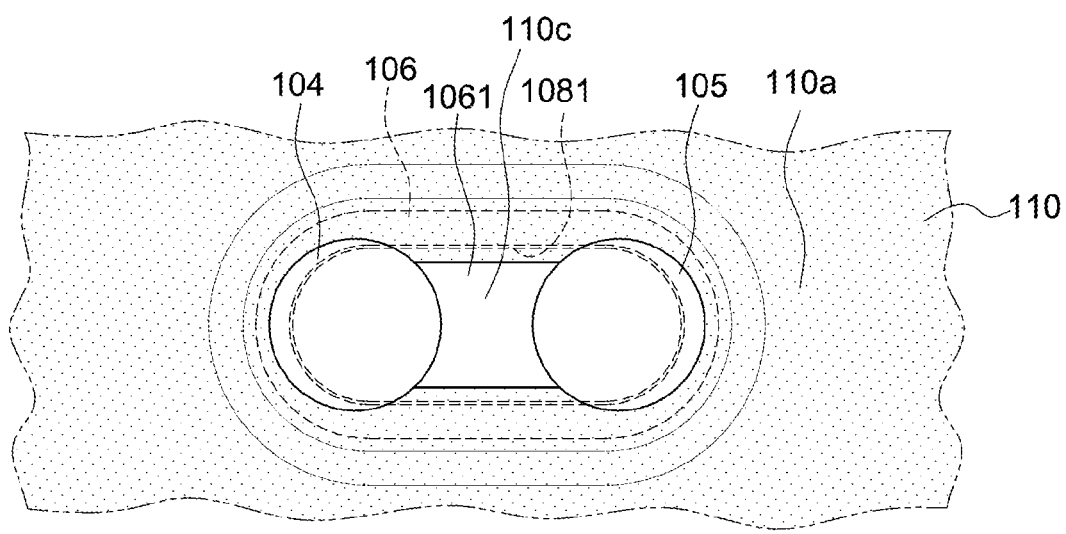
FIG. 5(b) illustrates a bottom view of the semiconductor device illustrated in FIG. 5(a).

FIG. 5(b) illustrates a bottom view of an embodiment of the semiconductor device 500 illustrated in FIG. 5(a). The second insulation layer 110 has one or more openings 110c. Each opening 110c exposes a portion 1061 of the bonding pad 106. In addition, a leftmost portion of the left pillar structure 104 is disposed over the surface 110a of the second insulation layer 110, and a rightmost portion of the right pillar structure 105 is disposed over the surface 110a of the second insulation layer 110.

Figure 6A:
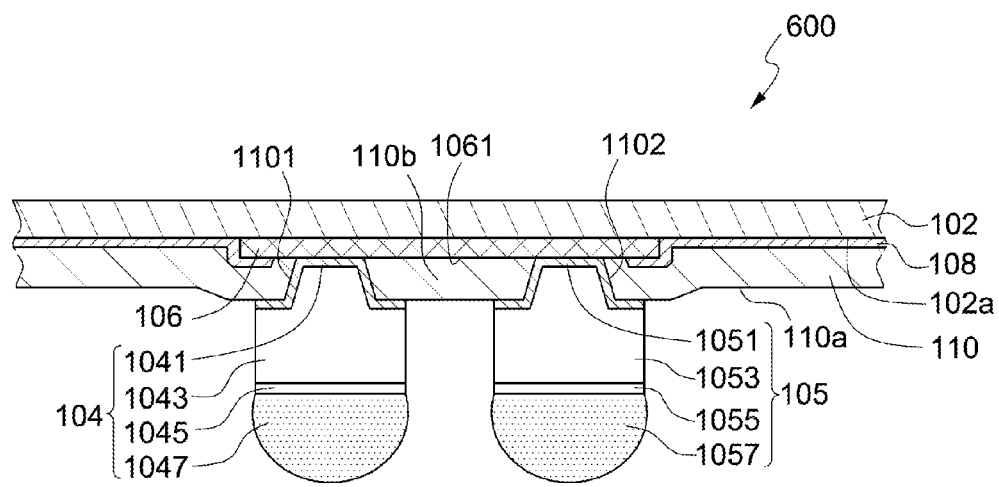
FIG. 6(a) illustrates a cross-sectional view of a semiconductor device according to another embodiment of the present disclosure.

FIG. 6(a) illustrates a cross-sectional view of a semiconductor device 600 according to another embodiment of the present disclosure. The semiconductor device 600 of this embodiment is similar to the semiconductor device 300 illustrated in FIG. 3(a), except that the two pillar structures 104, 105 extend beyond the space defined by the perimeter of the respective opening 1081 of the first insulation layer 108, instead of being fully inside the space defined by the perimeter of the respective opening 1081 as described for FIG. 3(a).

Figure 6B:
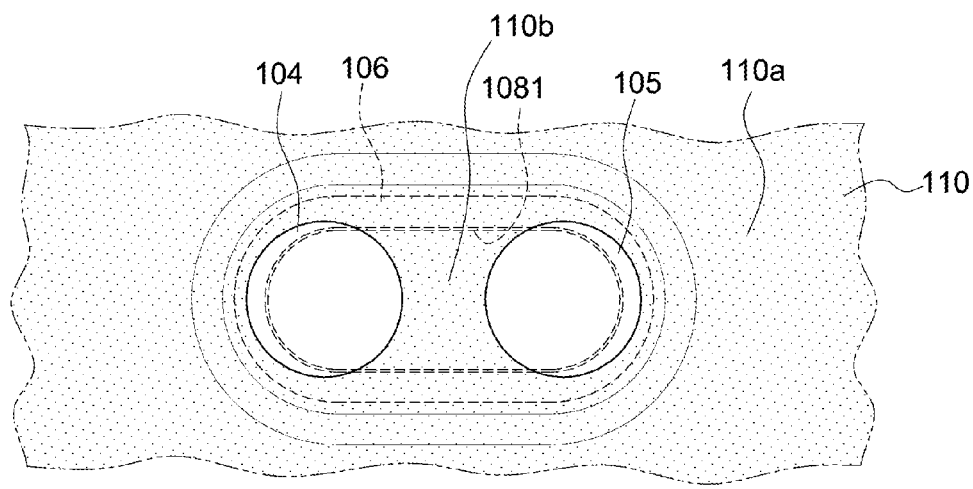
FIG. 6(b) illustrates a bottom view of the semiconductor device illustrated in FIG. 6(a).

FIG. 6(b) illustrates a bottom view of an embodiment of the semiconductor device 600 illustrated in FIG. 6(a). The second insulation layer 110 includes two or more openings 1101, 1102 above a respective single bonding pad 106. From the bottom view of the semiconductor device 600, the bonding pad 106 is covered by the second insulation layer 110 and the two pillar structures 104, 105.

Figure 7A:
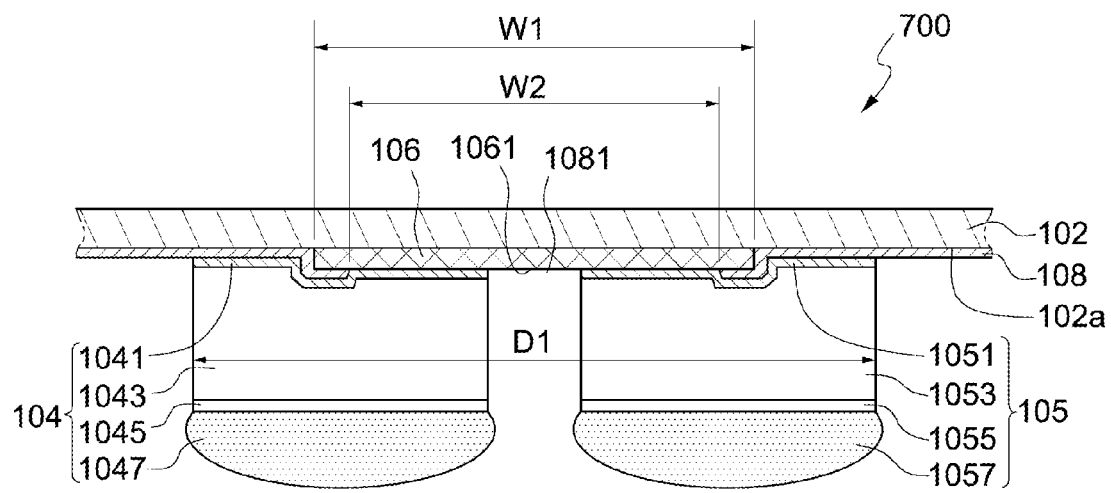
FIG. 7(a) illustrates a cross-sectional view of a semiconductor device according to another embodiment of the present disclosure.

FIG. 7(a) illustrates a cross-sectional view of a semiconductor device 700 according to another embodiment of the present disclosure. The semiconductor device 700 of this embodiment is similar to the semiconductor device 400 illustrated in FIG. 4(a), except that the two pillar structures 104, 105 extend beyond the space defined by the perimeter of the respective opening 1081 of the first insulating layer 108, and further beyond a periphery of the respective bonding pad 106. In this embodiment, the distance D1 is greater than the width W2 of the opening 1081, and is also greater than the width W1 of the bonding pad 106.

Figure 7B:
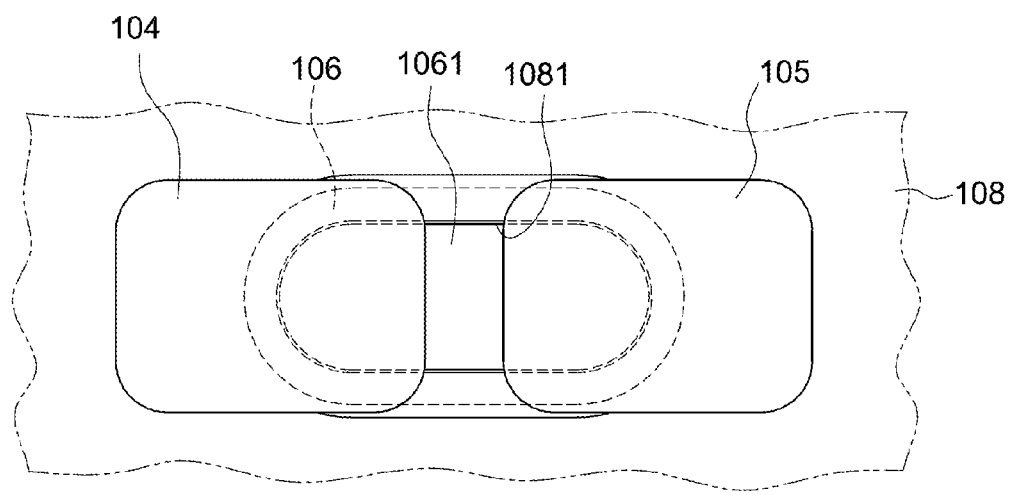
FIG. 7(b) illustrates a bottom view of the semiconductor device illustrated in FIG. 7(a).

FIG. 7(b) illustrates a bottom view of an embodiment of the semiconductor device 700 illustrated in FIG. 7(a). The opening 1081 exposes a portion 1061 of the bonding pad 106. In this embodiment, the shape of the respective pillar structures 104, 105 is generally rectangular.

Figure 8A:
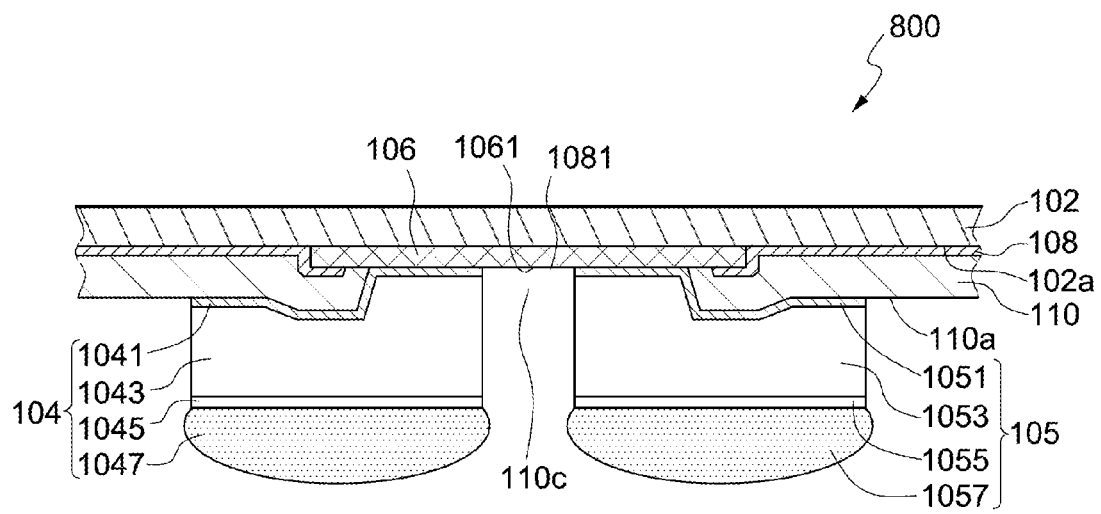
FIG. 8(a) illustrates a cross-sectional view of a semiconductor device according to another embodiment of the present disclosure.

FIG. 8(a) illustrates a cross-sectional view of a semiconductor device 800 according to another embodiment of the present disclosure. The semiconductor device 800 of this embodiment is similar to the semiconductor device 500 illustrated in FIG. 5(a), except that the two pillar structures 104, 105 extend beyond the space defined by the perimeter of the respective opening 1081 of the first insulating layer 108, and further beyond a periphery of the respective bonding pad 106.

Figure 8B:
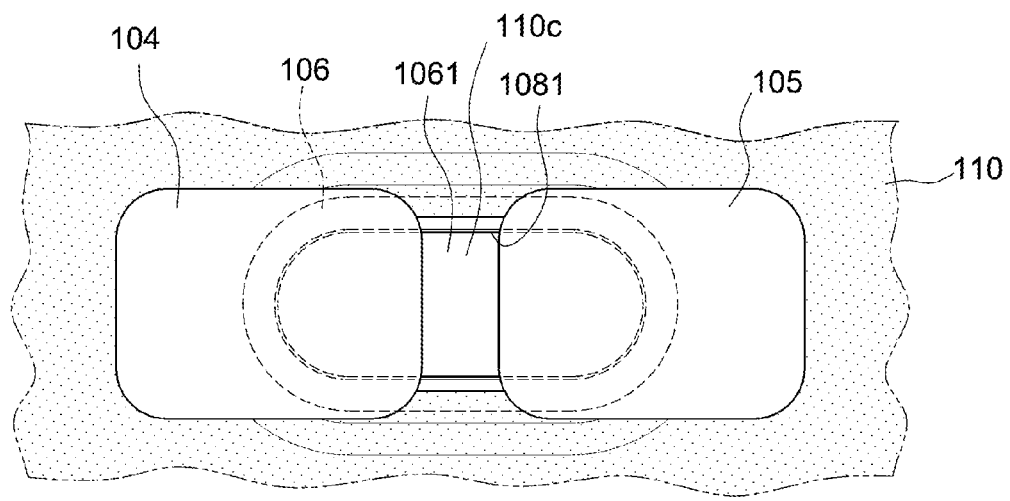
FIG. 8(b) illustrates a bottom view of the semiconductor device illustrated in FIG. 8(a).

FIG. 8(b) illustrates a bottom view of an embodiment of the semiconductor device 800 illustrated in FIG. 8(a). The second insulation layer 110 has one or more openings 110c. Each opening 110c exposes a portion 1061 of the bonding pad 106. In this embodiment, the shape of the respective pillar structures 104, 105 is generally rectangular.

Figure 9A:
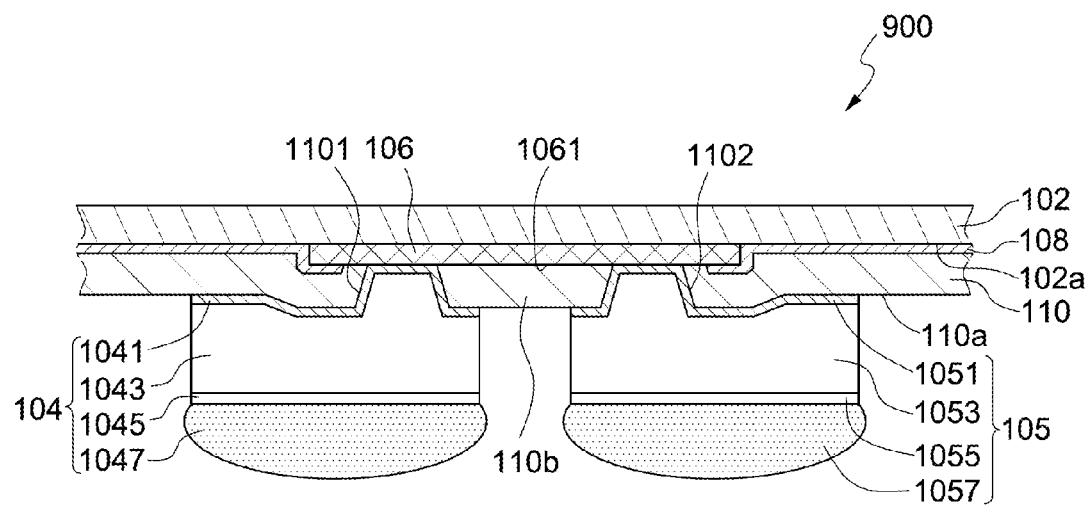
FIG. 9(a) illustrates a cross-sectional view of a semiconductor device according to another embodiment of the present disclosure.

FIG. 9(a) illustrates a cross-sectional view of a semiconductor device 900 according to another embodiment of the present disclosure. The semiconductor device 900 of this embodiment is similar to the semiconductor device 600 illustrated in FIG. 6(a), except that the two pillar structures 104, 105 extend beyond the space defined by the perimeter of the respective opening 1081 of the first insulating layer 108, and further beyond a periphery of the bonding pad 106.

Figure 9B:
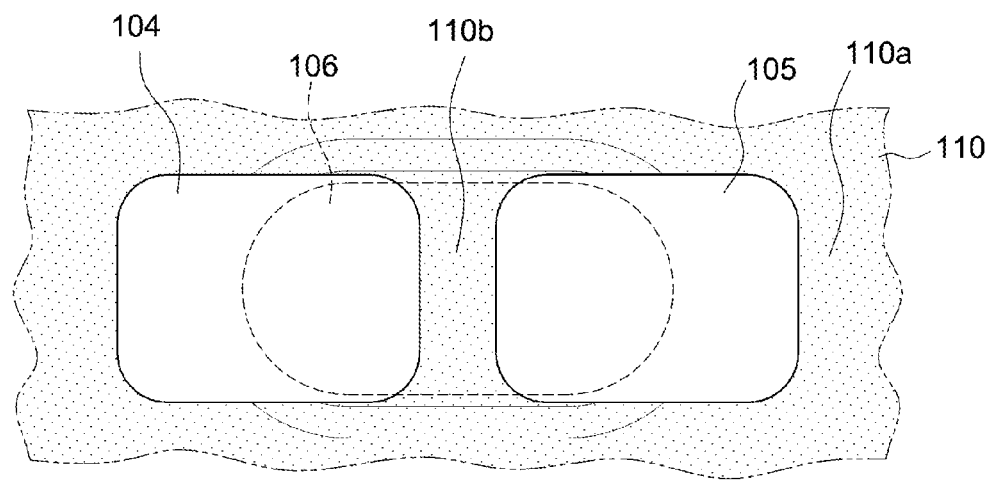
FIG. 9(b) illustrates a bottom view of the semiconductor device illustrated in FIG. 9(a).

FIG. 9(b) illustrates a bottom view of an embodiment of the semiconductor device 900 illustrated in FIG. 9(a). From the bottom view of the semiconductor device 900, the bonding pad 106 is covered by the second insulation layer 110 and the two pillar structures 104, 105. In this embodiment, the shape of the respective pillar structures 104, 105 is generally rectangular.

Figure 10A:
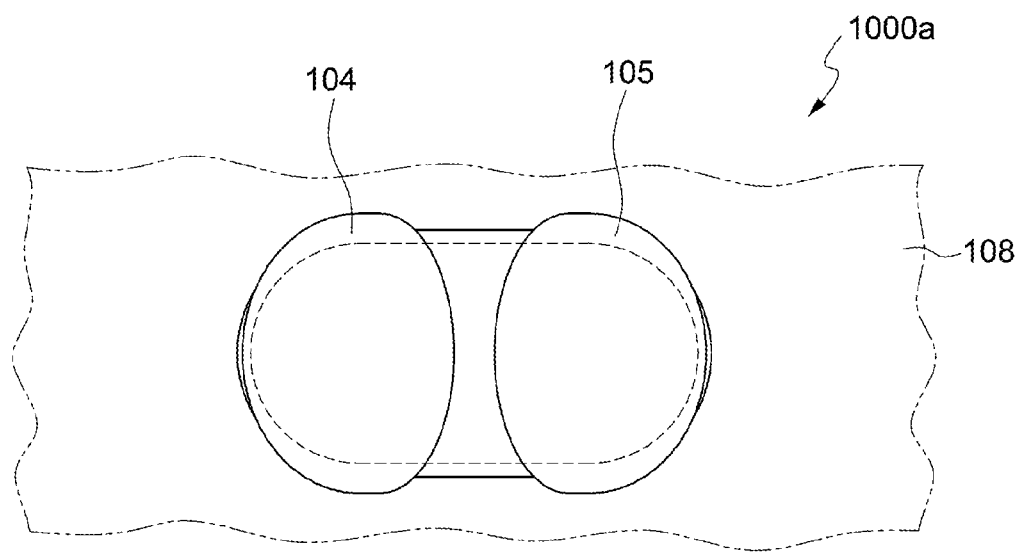
FIG. 10(a) illustrates a bottom view of a semiconductor device according to another embodiment of the present disclosure.

FIG. 10(a) illustrates a bottom view of a semiconductor device 1000a according to another embodiment of the present disclosure. The semiconductor device 1000a of this embodiment is similar to the semiconductor device 400 illustrated in FIGS. 4(a) and 4(b), except that the shape of each of the pillar structures 104, 105 from the bottom view is a shape of a gibbous moon. In some embodiments, the shape of each of the pillar structures 104, 105 from the bottom view is closer to a semiellipse.

Figure 10B:
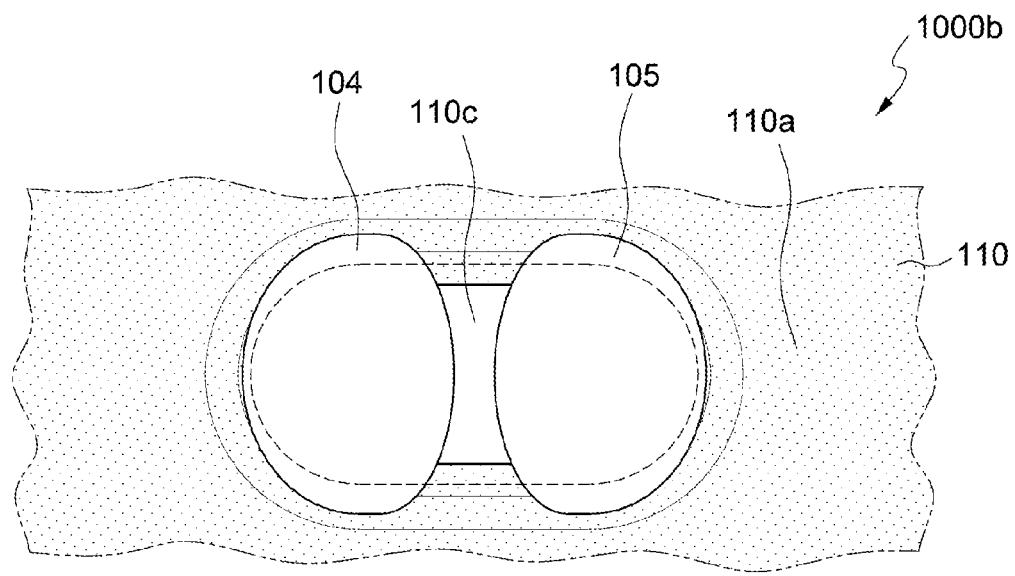
FIG. 10(b) illustrates a bottom view of a semiconductor device according to another embodiment of the present disclosure.

FIG. 10(b) illustrates a bottom view of a semiconductor device 1000b according to another embodiment of the present disclosure. The semiconductor device 1000b of this embodiment is similar to the semiconductor device 500 illustrated in FIGS. 5(a) and 5(b), except that the shape of each of the pillar structures 104, 105 from the bottom view is a shape of a gibbous moon. In some embodiments, the shape of each of the pillar structures 104, 105 from the bottom view is closer to a semiellipse.

Figure 10C:
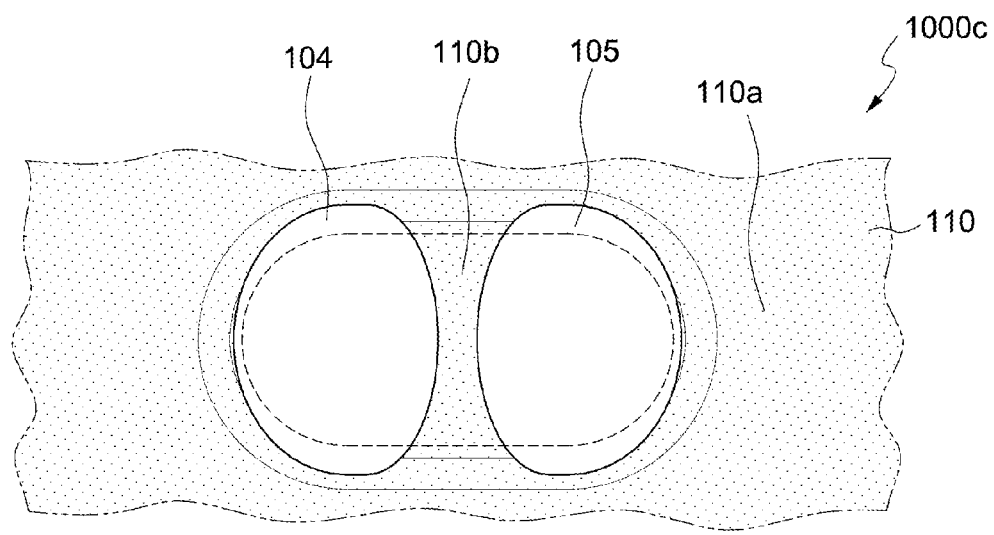
FIG. 10(c) illustrates a bottom view of a semiconductor device according to another embodiment of the present disclosure.

FIG. 10(c) illustrates a bottom view of a semiconductor device 1000c according to another embodiment of the present disclosure. The semiconductor device 1000c of this embodiment is similar to the semiconductor device 600 illustrated in FIGS. 6(a) and 6(b), except that the shape of each of the pillar structures 104, 105 from the bottom view is a shape of a gibbous moon. In some embodiments, the shape of each of the pillar structures 104, 105 from the bottom view is closer to a semiellipse.

Figure 11A:
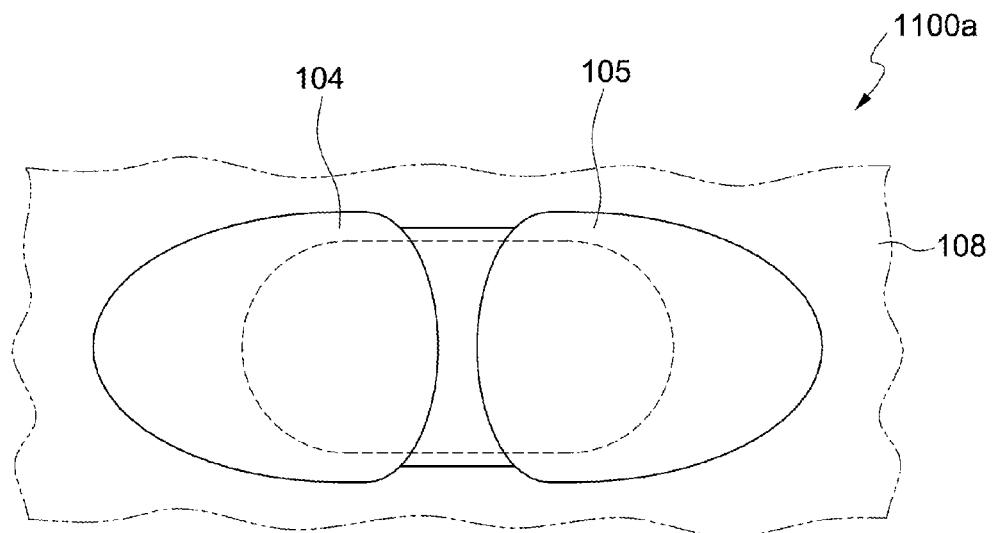
FIG. 11(a) illustrates a bottom view of a semiconductor device according to another embodiment of the present disclosure.

FIG. 11(a) illustrates a bottom view of a semiconductor device 1100a according to another embodiment of the present disclosure. The semiconductor device 1100a of this embodiment is similar to the semiconductor device 700 illustrated in FIGS. 7(a) and 7(b), except that the shape of each of the pillar structures 104, 105 from the bottom view is a shape of a gibbous moon. In some embodiments, the shape of each of the pillar structures 104, 105 from the bottom view is closer to a semiellipse.

Figure 11B:
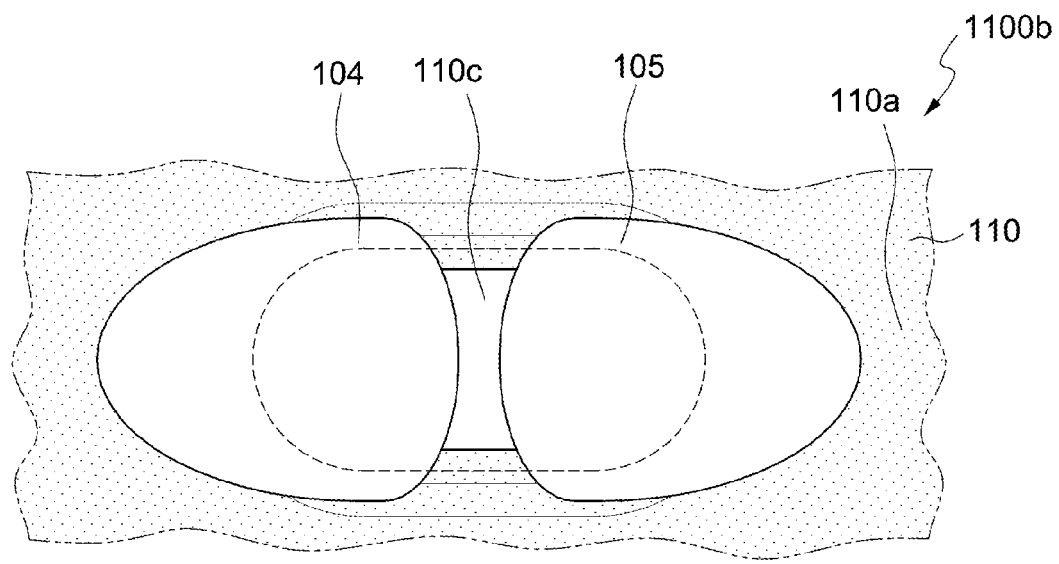
FIG. 11(b) illustrates a bottom view of a semiconductor device according to another embodiment of the present disclosure.

FIG. 11(b) illustrates a bottom view of a semiconductor device 1100b according to another embodiment of the present disclosure. The semiconductor device 1100b of this embodiment is similar to the semiconductor device 800 illustrated in FIGS. 8(a) and 8(b), except that the shape of each of the pillar structures 104, 105 from the bottom view is a shape of a gibbous moon. In some embodiments, the shape of each of the pillar structures 104, 105 from the bottom view is closer to a semiellipse.

Figure 11C:
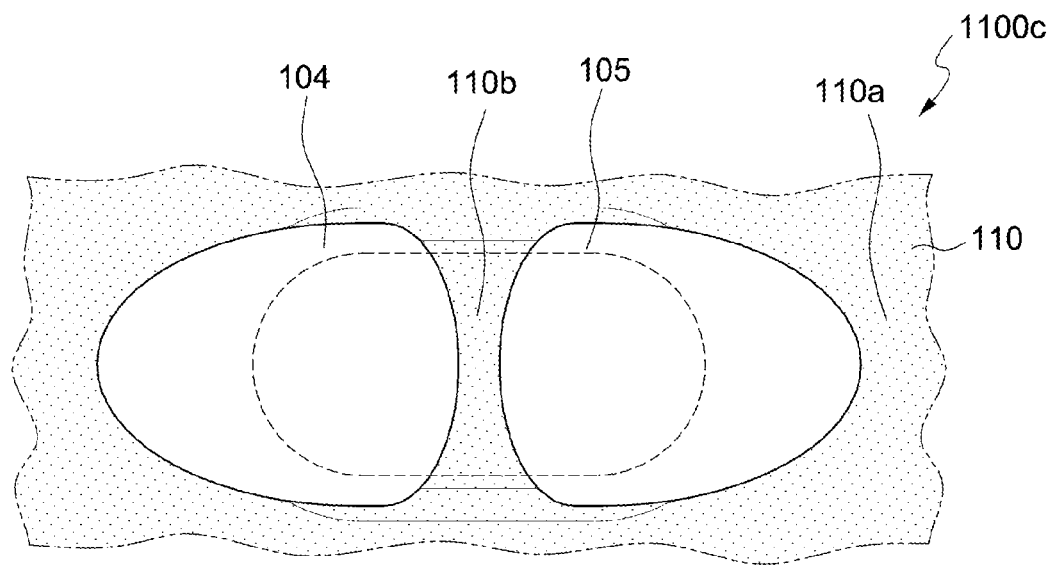
FIG. 11(c) illustrates a bottom view of a semiconductor device according to another embodiment of the present disclosure.

FIG. 11(c) illustrates a bottom view of a semiconductor device 1100c according to another embodiment of the present disclosure. The semiconductor device 1100c of this embodiment is similar to the semiconductor device 900 illustrated in FIGS. 9(a) and 9(b), except that the shape of each of the pillar structures 104, 105 from the bottom view is a shape of a gibbous moon. In some embodiments, the shape of each of the pillar structures 104, 105 from the bottom view is closer to a semiellipse.

Although the shape of each of the pillar structures 104, 105 from the bottom view can be a shape of a circle, a rectangle, a gibbous moon or a semiellipse as illustrated by way of example in the figures above, it should be noted that the shape of each of the pillar structures 104, 105 from the bottom view is not limited to the above-mentioned embodiments, and any shape is contemplated in the present disclosure, including other polygonal and non-polygonal shapes.

Figure 12A:
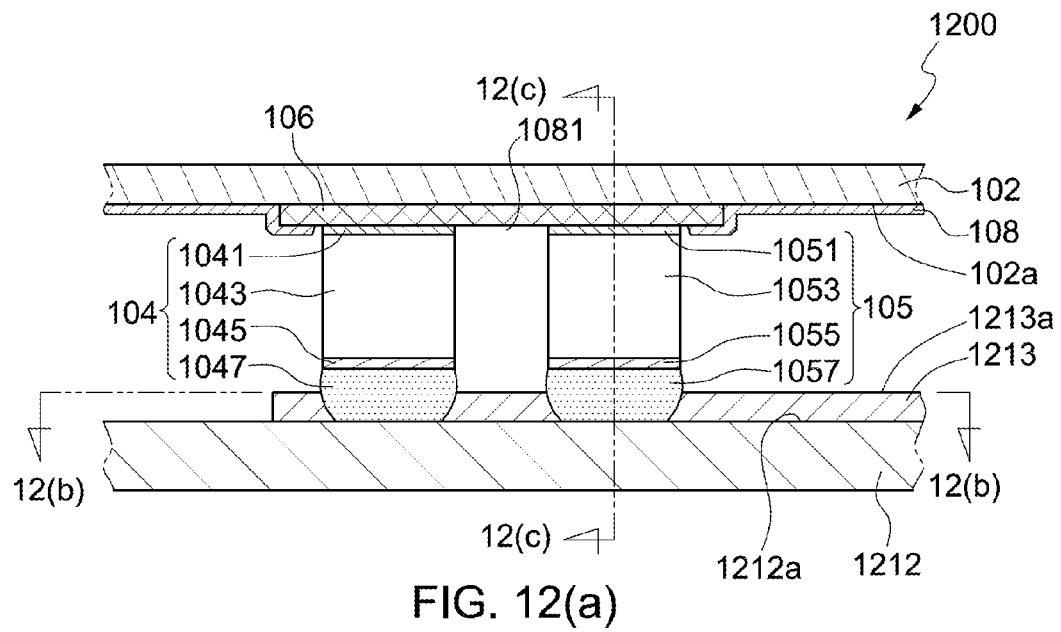
FIG. 12(a) illustrates a cross-sectional view of a semiconductor package according to an embodiment of the present disclosure.

FIG. 12(a) illustrates a cross-sectional view of a semiconductor package 1200 according to another embodiment of the present disclosure. The semiconductor package 1200 comprises a semiconductor element 102, two pillar structures 104, 105, a first insulation layer 108, and a substrate 1212.

The semiconductor element 102, the pillar structures 104, 105, and the first insulation layer 108 of the semiconductor package 1200 of this embodiment are illustrated by way of non-limiting example as being the same as the semiconductor element 102, the pillar structures 104, 105, and the first insulation layer 108 of the semiconductor device 100 illustrated in FIG. 1(a), respectively, to show the orientation of the substrate 1212 with respect to a semiconductor device such as the semiconductor device 100. It should be understood that the semiconductor device in various embodiments of the semiconductor package 1200 may be one of the semiconductor devices 100 (FIG. 1(a)), 400 (FIG. 4(a)), 700 (FIG. 7(a)), 1000a (FIG. 10(a)) and 1100a (FIG. 11(a)).

Figure 12B:
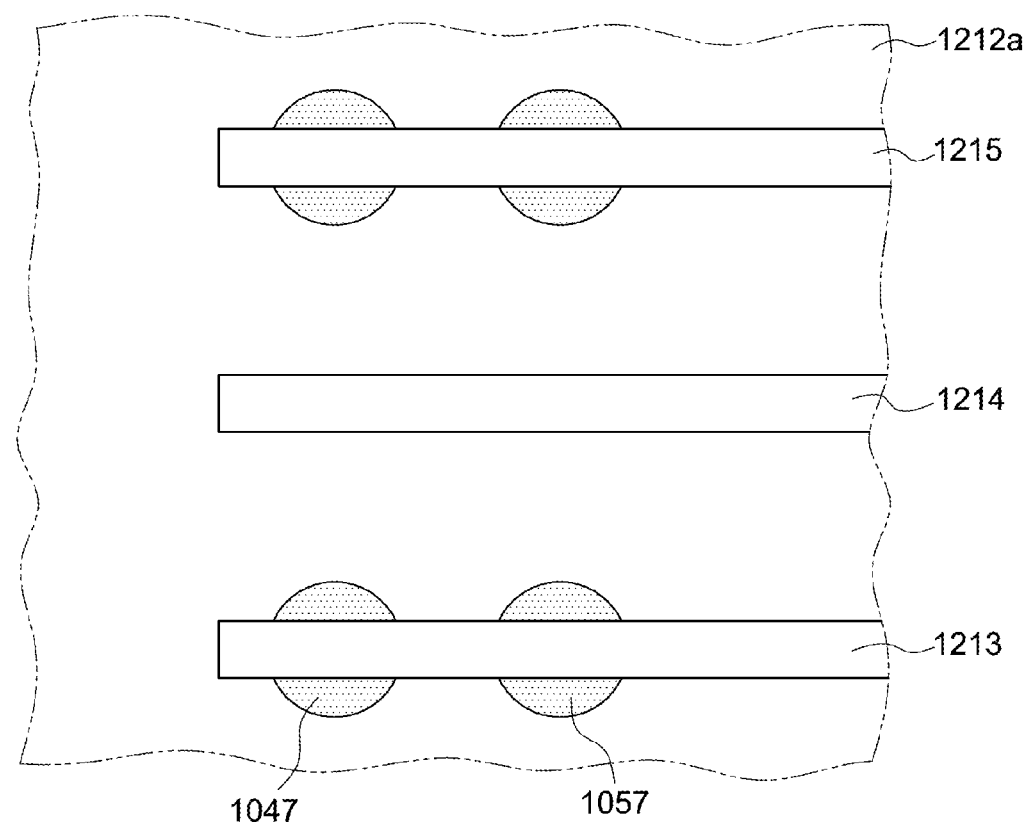
FIG. 12(b) illustrates a bottom view taken along line 12(b)-12(b) of the semiconductor package in FIG. 12(a).

The substrate 1212 comprises a first surface 1212a, a first trace 1213, a second trace 1214 (illustrated in FIG. 12(b)), and a third trace 1215 (illustrated in FIG. 12(b)). The first surface 1212a of the substrate 1212 faces the first surface 102a (active surface) of the semiconductor element 102. In another embodiment, there may be more than one trace disposed between the first trace 1213 and the third trace 1215. Each of the first trace 1213, the second trace 1214, and the third trace 1215 includes copper, or may also include another metal or metal alloy or other conductive materials. The traces 1213, 1214, 1215 are disposed adjacent to the first surface 1212a. In this embodiment, the traces 1213, 1214, 1215 are disposed on the first surface 1212a, that is, the traces 1213, 1214, 1215 protrude from the first surface 1212a. The first trace 1213 has a top surface 1213a. The solder layers 1047, 1057 of the respective two pillar structures 104, 105 are disposed between the respective two pillars 1043, 1053 and the first trace 1213 so as to electrically connect the first trace 1213 and the semiconductor element 102. That is, the two pillar structures 104, 105 are bonded to the first trace 1213.

FIG. 12(b) illustrates a bottom view taken along line 12(b)-12(b) of the semiconductor package 1200 in FIG. 12(a). In this embodiment, a second trace 1214 is disposed between the first trace 1213 and a third trace 1215. Each of the first trace 1213 and the third trace 1215 has at least two pillar structures disposed thereon. In this embodiment, each of the first trace 1213, the second trace 1214, and the third trace 1215 has a consistent width.

Figure 12C:
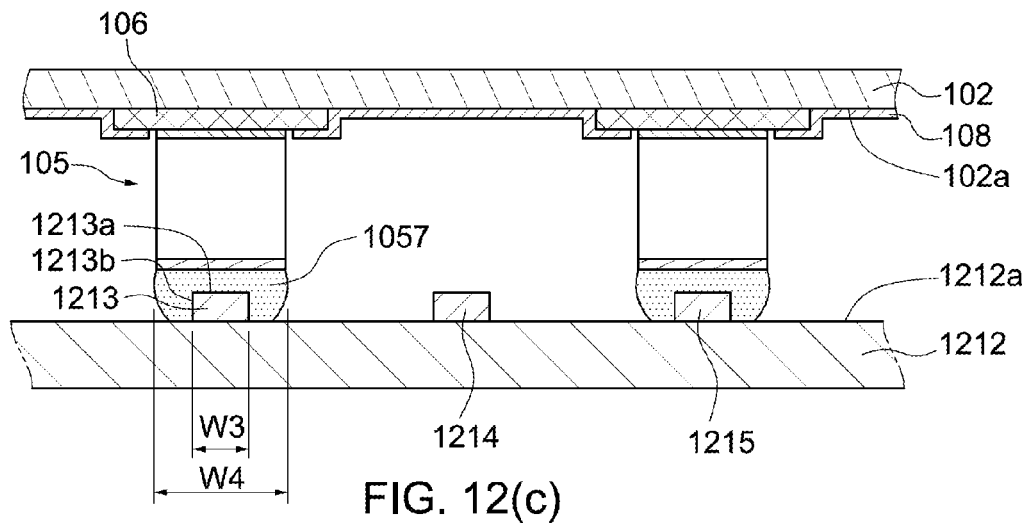
FIG. 12(c) illustrates a cross-sectional view taken along line 12(c)-12(c) of the semiconductor package in FIG. 12(a).

FIG. 12(c) illustrates a cross-sectional view taken along line 12(c)-12(c) of the semiconductor package 1200 in FIG. 12(a). Each of the first trace 1213, the second trace 1214, and the third trace 1215 protrudes from the first surface 1212a of the substrate 1212. That is, the top surface 1213a of the first trace 1213, a top surface of the second trace 1214, and a top surface of the third trace 1215 are above the first surface 1212a of the substrate 1212. In this embodiment, described with respect to the pillar structure 105, a width W3 of the first trace 1213 is less than a width W4 of the pillar structure 105, so the solder layer 1057 would flow along a side surface 1213b of the first trace 1213. A molding compound (not shown) may be disposed between the substrate 1212 and the semiconductor element 102 so as to protect the two pillar structures 104, 105.

Figure 13A:
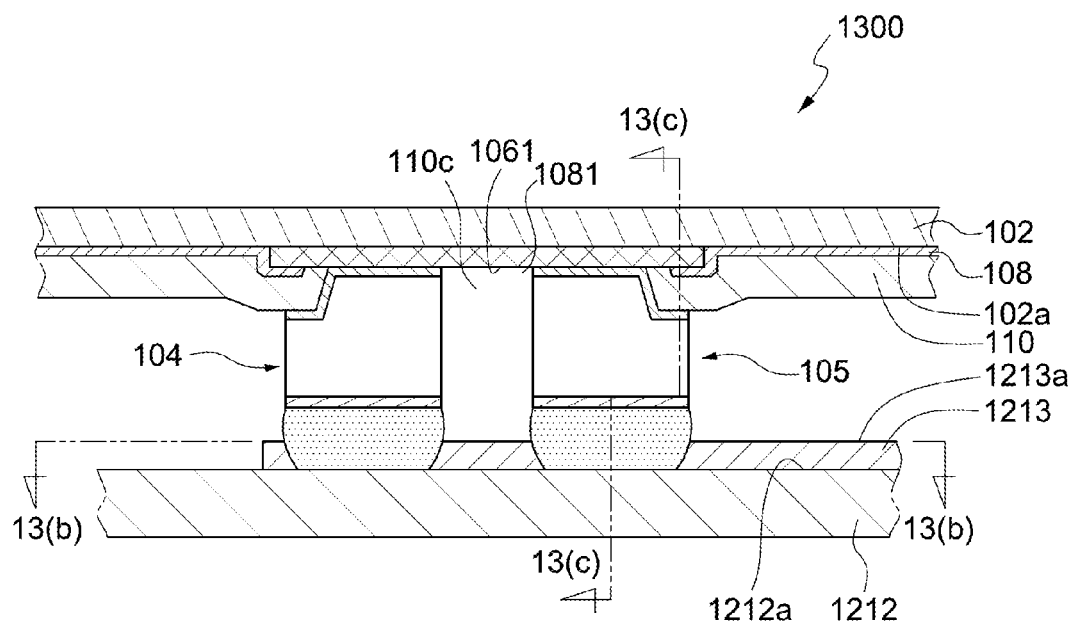
FIG. 13(a) illustrates a cross-sectional view of a semiconductor package according to another embodiment of the present disclosure

FIG. 13(a) illustrates a cross-sectional view of a semiconductor package 1300 according to another embodiment of the present disclosure. The semiconductor package of this embodiment is similar to the semiconductor package 1200 illustrated in FIG. 12(a) except that a second insulation layer 110 covers the first insulation layer 108 and a portion of each of the bonding pad 106. The semiconductor element 102, the pillar structures 104, 105, the first insulation layer 108 and the second insulation layer 110 of the semiconductor package 1300 of this embodiment are illustrated by way of non-limiting example as being the same as the semiconductor element 102, the pillar structures 104, 105, the first insulation layer 108 and the second insulation layer 110 of the semiconductor device 200 illustrated in FIG. 2(a), respectively, to show the orientation of the substrate 1212 with respect to a semiconductor device such as the semiconductor device 200. It should be understood that the semiconductor device in various embodiments of the semiconductor package 1300 may be one of the semiconductor devices 200 (FIG. 2(a)), 500 (FIG. 5(a)), 800 (FIG. 8(a)), 1000b (FIG. 10(b)) and 1100b (FIG. 11(b)).

Figure 13B:
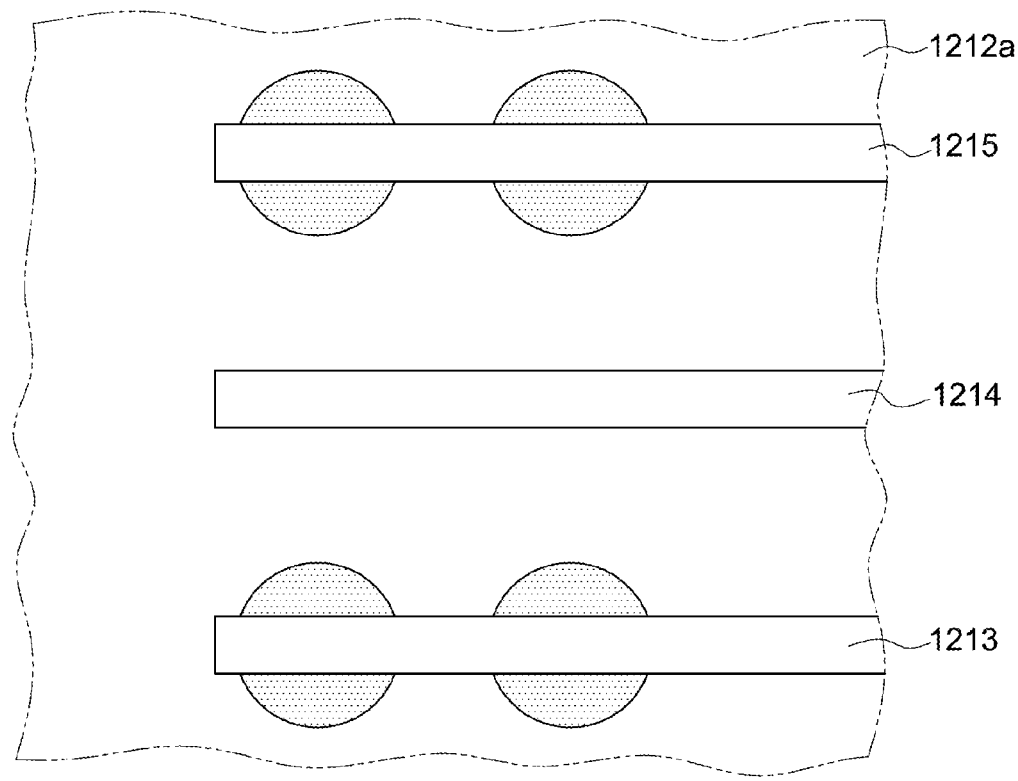
FIG. 13(b) illustrates a bottom view taken along line 13(b)-13(b) of the semiconductor package in FIG. 13(a).

FIG. 13(b) illustrates a bottom view taken along line 13(b)-13(b) of the semiconductor package 1300 in FIG. 13(a). In this embodiment, each of the first trace 1213 and a third trace 1215 has at least two pillar structures disposed thereon. In this embodiment, each of the first trace 1213, a second trace 1214, and the third trace 1215 has a consistent width.

Figure 13C:
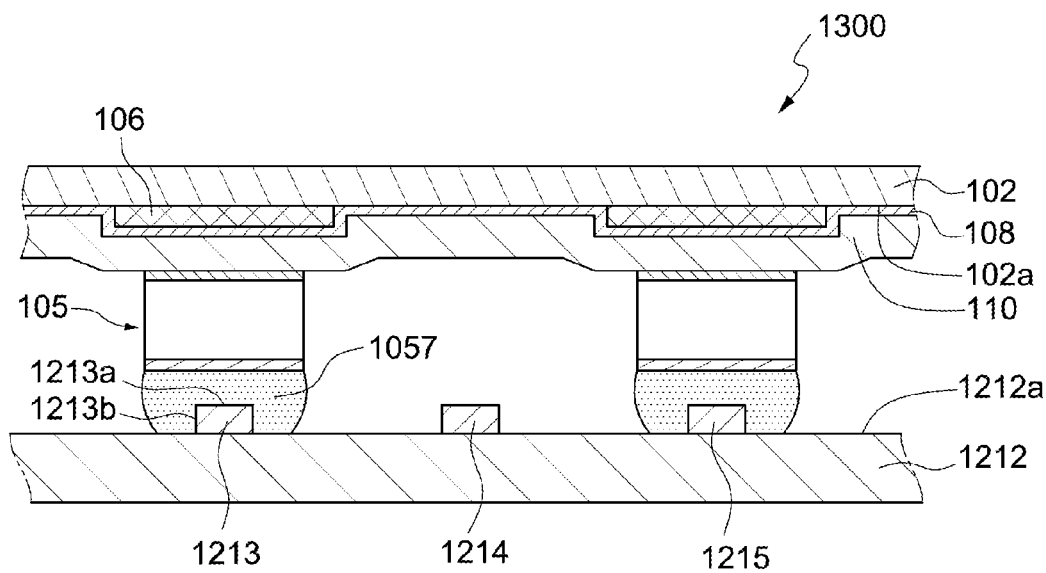
FIG. 13(c) illustrates a cross-sectional view taken along line 13(c)-13(c) of the semiconductor package in FIG. 13(a).

FIG. 13(c) illustrates a cross-sectional view taken along line 13(c)-13(c) of the semiconductor package 1300 in FIG. 13(a). Each of the first trace 1213, the second trace 1214, and the third trace 1215 protrudes from the first surface 1212a of the substrate 1212. That is, the top surface 1213a of the first trace 1213, a top surface of the second trace 1214, and a top surface of the third trace 1215 are above the first surface 1212a of the substrate 1212. A molding compound (not shown) may be disposed between the substrate 1212 and the semiconductor element 102 so as to protect the two pillar structures 104, 105.

Figure 14A:
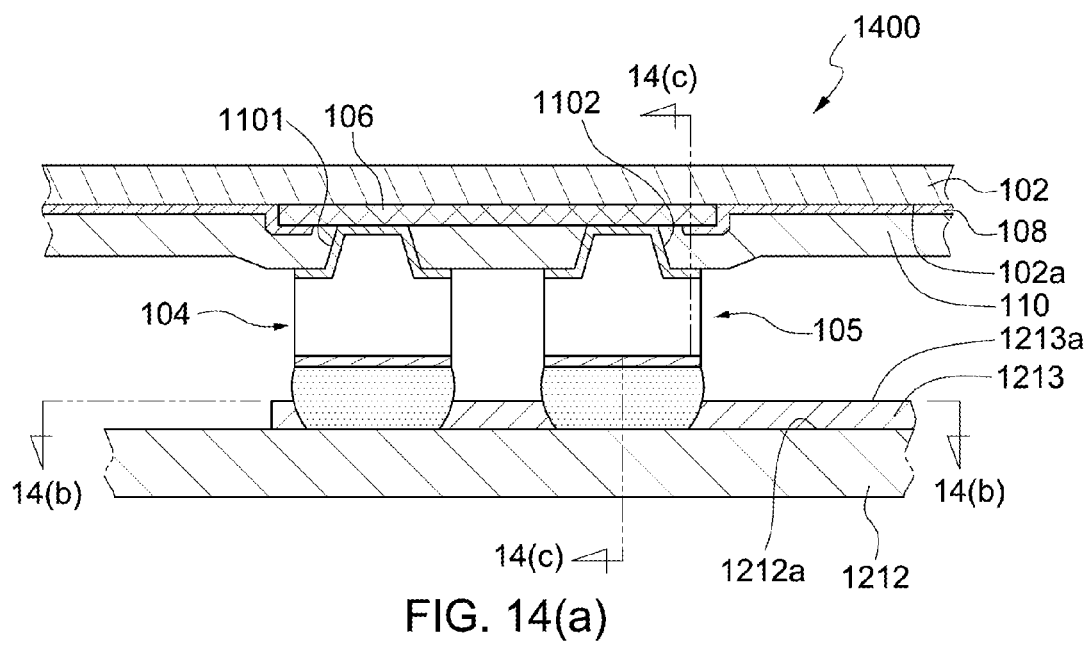
FIG. 14(a) illustrates a cross-sectional view of a semiconductor package according to another embodiment of the present disclosure.

FIG. 14(a) illustrates a cross-sectional view of a semiconductor package 1400 according to another embodiment of the present disclosure. The semiconductor package of this embodiment is similar to the semiconductor package 1300 illustrated in FIG. 13(a) except that the second insulation layer 110 has two or more openings 1101, 1102 corresponding to the single bonding pad 106. The semiconductor element 102, the pillar structures 104, 105, the first insulation layer 108 and the second insulation layer 110 of the semiconductor package 1400 of this embodiment are illustrated by way of non-limiting example as being the same as the semiconductor element 102, the pillar structures 104, 105, the first insulation layer 108 and the second insulation layer 110 of the semiconductor device 200 illustrated in FIG. 3(a), respectively, to show the orientation of the substrate 1212 with respect to a semiconductor device such as the semiconductor device 300. It should be understood that the semiconductor device in various embodiments of the semiconductor package 1400 may be one of the semiconductor devices 300 (FIG. 3a), 600 (FIG. 6(a)), 900 (FIG. 9(a)), 1000c (FIG. 10(c)) and 1100c (FIG. 11(c)).

Figure 14B:
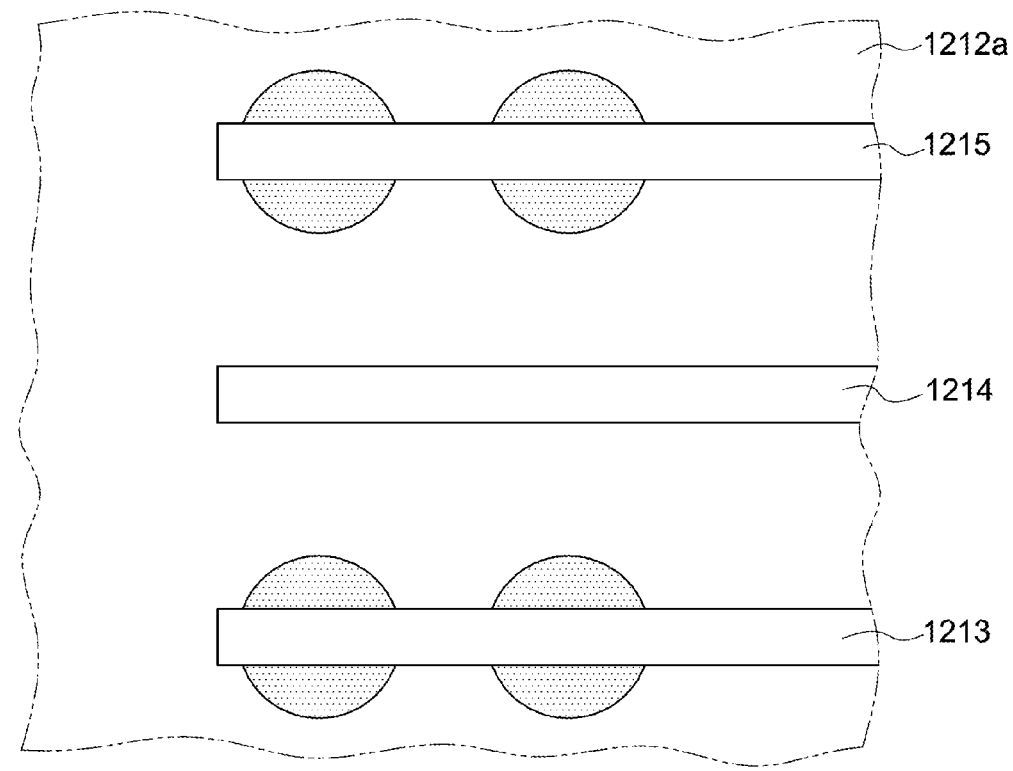
FIG. 14(b) illustrates a bottom view taken along line 14(b)-14(b) of the semiconductor package in FIG. 14(a).

FIG. 14(b) illustrates a bottom view taken along line 14(b)-14(b) of the semiconductor package 1400 in FIG. 14(a). In this embodiment, each of the first trace 1213 and a third trace 1215 has at least two pillar structures disposed thereon. In this embodiment, each of the first trace 1213, a second trace 1214, and the third trace 1215 has a consistent width.

Figure 14C:
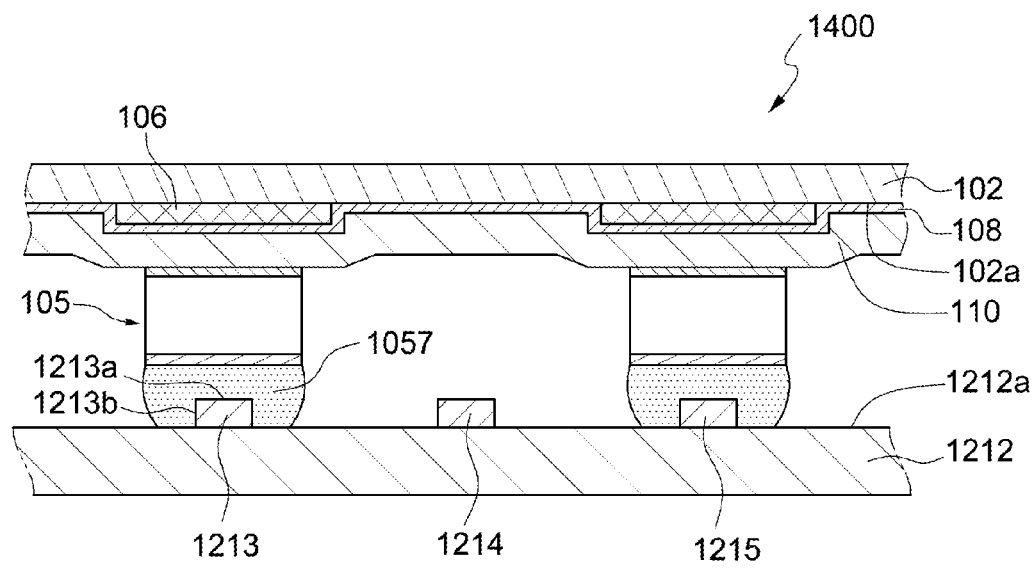
FIG. 14(c) illustrates a cross-sectional view taken along line 14(c)-14(c) of the semiconductor package in FIG. 14(a).

FIG. 14(c) illustrates a cross-sectional view taken along line 14(c)-14(c) of the semiconductor package 1400 in FIG. 14(a). Each of the first trace 1213, the second trace 1214, and the third trace 1215 protrudes from the first surface 1212a of the substrate 1212. That is, the top surface 1213a of the first trace 1213, a top surface of the second trace 1214, and a top surface of the third trace 1215 are above the first surface 1212a of the substrate 1212. A molding compound (not shown) may be disposed between the substrate 1212 and the semiconductor element 102 so as to protect the two pillar structures 104, 105.

Figure 15A:
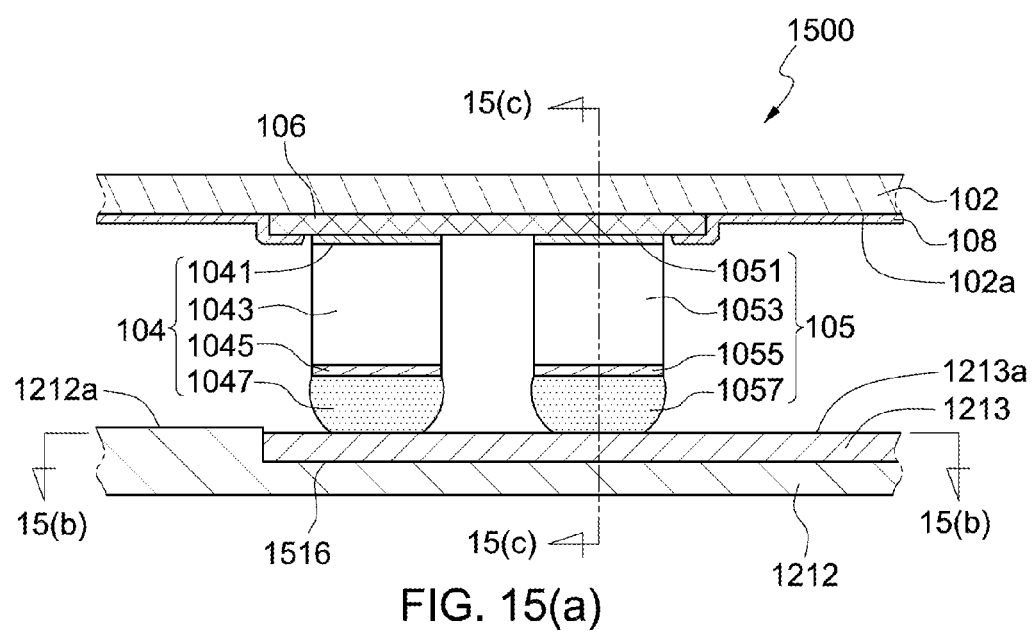
FIG. 15(a) illustrates a cross-sectional view of a semiconductor package according to another embodiment of the present disclosure.

FIG. 15(a) illustrates a cross-sectional view of a semiconductor package 1500 according to another embodiment of the present disclosure. The semiconductor package 1500 of this embodiment is similar to the semiconductor package 1200 illustrated in FIG. 12(a), except that the first trace 1213, a second trace 1214 (illustrated in FIG. 15(b)), and a third trace 1215 (illustrated in FIG. 15(b)) of the substrate 1212 are recessed from the first surface 1212a of the substrate 1212. For example, the substrate 1212 has a recess portion 1516 to accommodate the first trace 1213. That is, a top surface 1213a of the first trace 1213, a top surface of the second trace 1214, and a top surface of the third trace 1215 (FIG. 15(c)) are below the first surface 1212a of the substrate 1212.

Figure 15B:
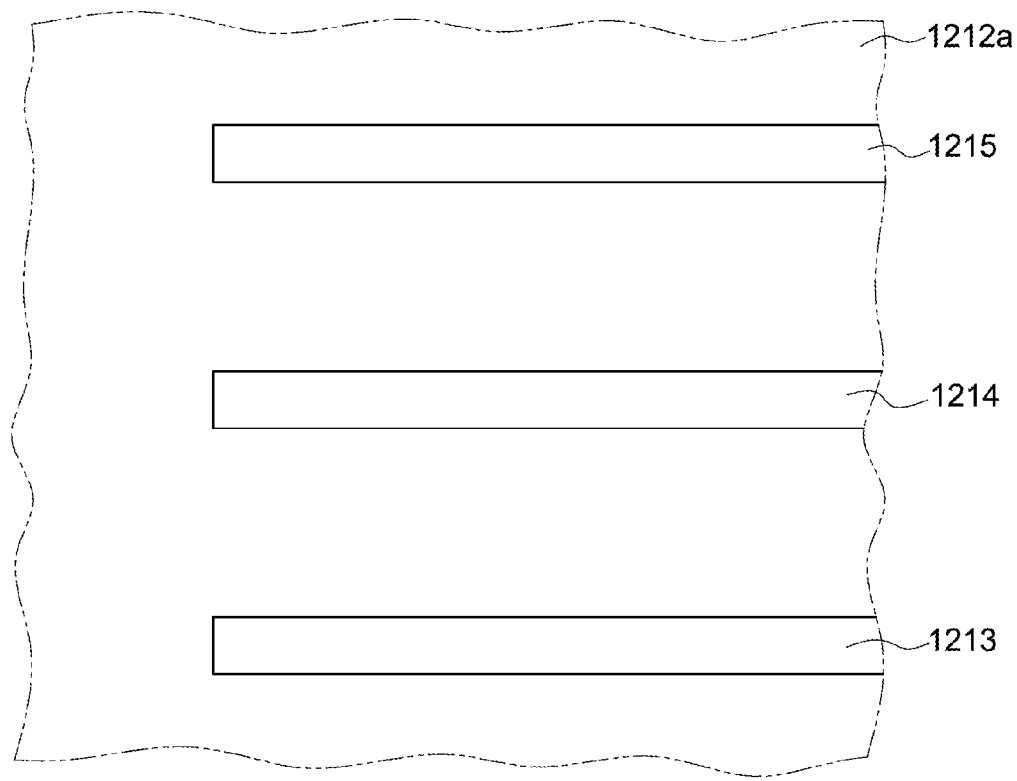
FIG. 15(b) illustrates a bottom view taken along line 15(b)-15(b) of the semiconductor package in FIG. 15(a).

FIG. 15(b) illustrates a bottom view taken along line 15(b)-15(b) of the semiconductor package 1500 in FIG. 15(a). In this embodiment, the second trace 1214 is disposed between the first trace 1213 and the third trace 1215. Each of the first trace 1213 and the third trace 1215 has at least two pillar structures disposed thereon. In this embodiment, each of the first trace 1213, the second trace 1214, and the third trace 1215 has a consistent width.

Figure 15C:
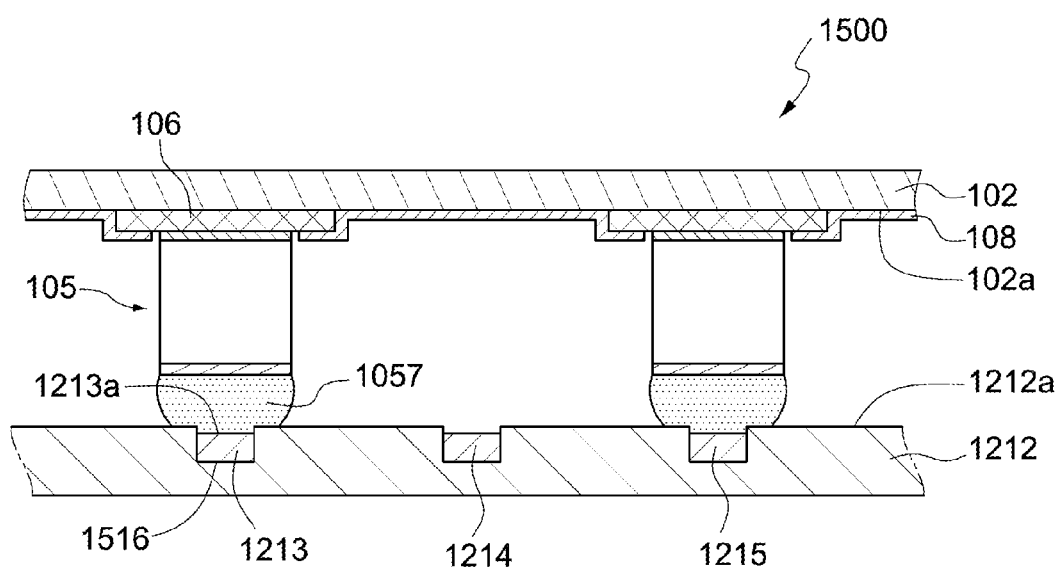
FIG. 15(c) illustrates a cross-sectional view taken along line 15(c)-15(c) of the semiconductor package in FIG. 15(a).

FIG. 15(c) illustrates a cross-sectional view taken along line 15(c)-15(c) of the semiconductor package 1500 in FIG. 15(a). Each of the first trace 1213, the second trace 1214, and the third trace 1215 are embedded in the substrate 1212. That is, the top surface 1213a of the first trace 1213, a top surface of the second trace 1214, and a top surface of the third trace 1215 are below the first surface 1212a of the substrate 1212. In this embodiment, for example, portion of the solder layer 1057 of the pillar structure 105 is disposed on the first trace 1213 in the recess portion 1516. A molding compound (not shown) may be disposed between the substrate 1212 and the semiconductor element 102 so as to protect the two pillar structures 104, 105.

Figure 16A:
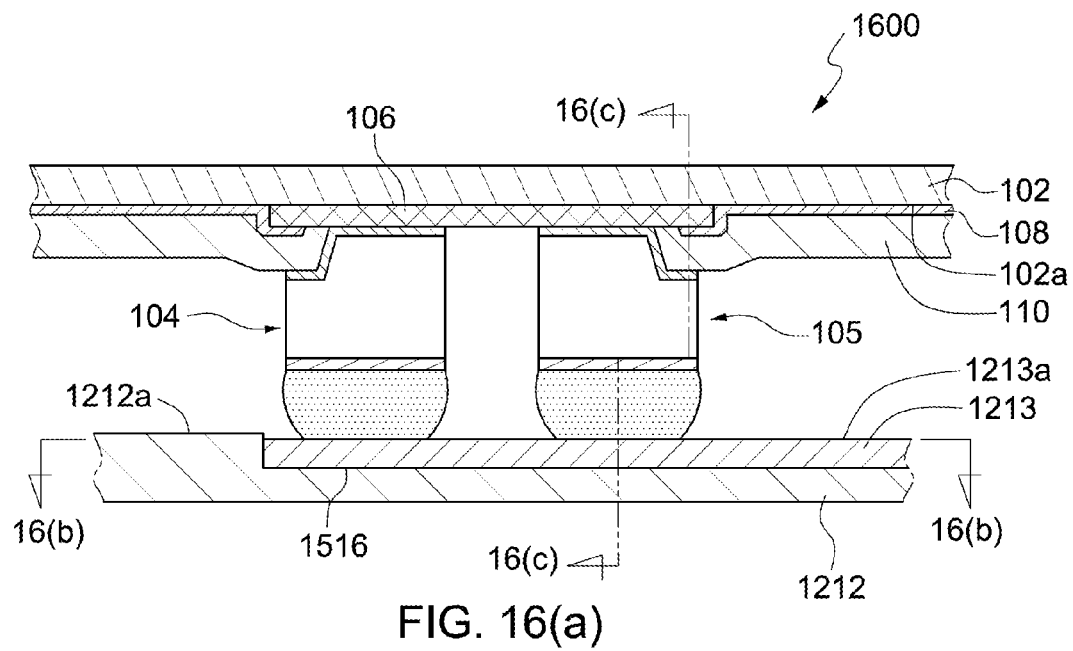
FIG. 16(a) illustrates a cross-sectional view of a semiconductor package according to another embodiment of the present disclosure.

FIG. 16(a) illustrates a cross-sectional view of a semiconductor package 1600 according to another embodiment of the present disclosure. The semiconductor package 1600 of this embodiment is similar to the semiconductor package 1500 illustrated in FIG. 15(a), except that a second insulation layer 110 covers the first insulation layer 108 and a portion of the bonding pad 106. The second insulation layer 110 has one or more openings 110c. Each opening 110c corresponds to a respective bonding pad 106 and exposes a portion of the respective bonding pad 106.

Figure 16B:
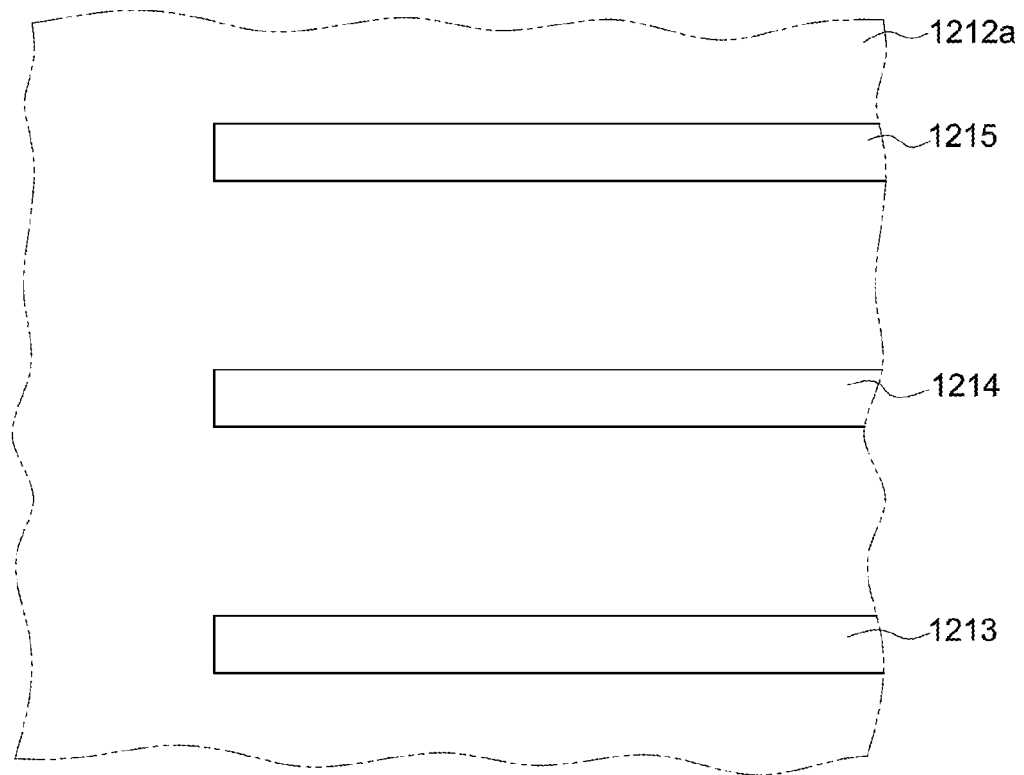
FIG. 16(b) illustrates a bottom view taken along line 16(b)-16(b) of the semiconductor package in FIG. 16(a).

FIG. 16(b) illustrates a bottom view taken along line 16(b)-16(b) of the semiconductor package 1600 in FIG. 16(a). In this embodiment, each of the first trace 1213 and a third trace 1215 has at least two pillar structures disposed thereon. In this embodiment, each of the first trace 1213, a second trace 1214, and the third trace 1215 has a consistent width.

Figure 16C:
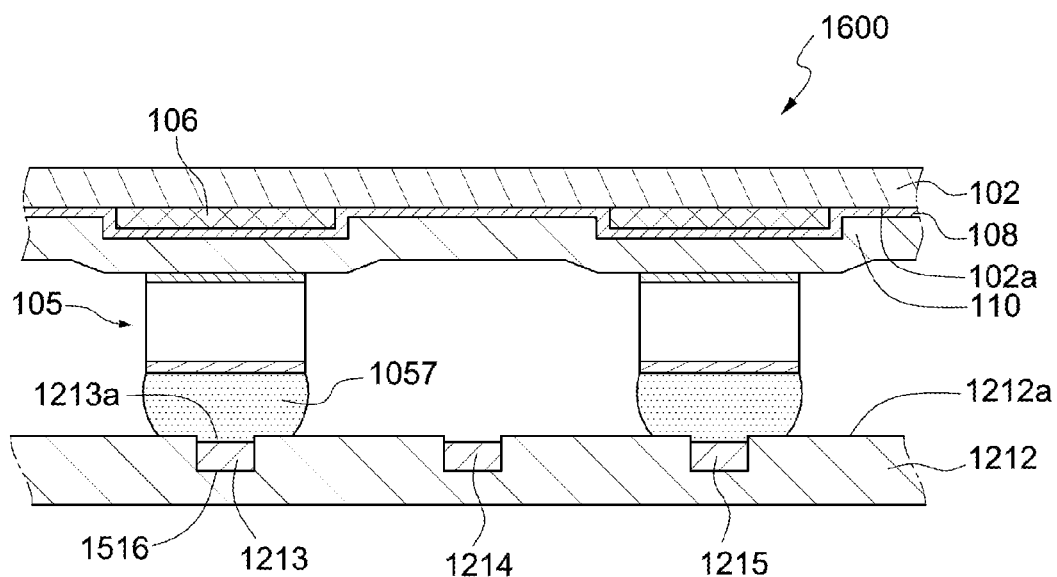
FIG. 16(c) illustrates a cross-sectional view taken along line 16(c)-16(c) of the semiconductor package in FIG. 16(a).

FIG. 16(c) illustrates a cross-sectional view taken along line 16(c)-16(c) of the semiconductor package 1600 in FIG. 16(a). Each of the first trace 1213, the second trace 1214, and the third trace 1215 are embedded in the substrate 1212. That is, the top surface 1213a of the first trace 1213, a top surface of the second trace 1214, and a top surface of the third trace 1215 are below the first surface 1212a of the substrate 1212.

Figure 17A:
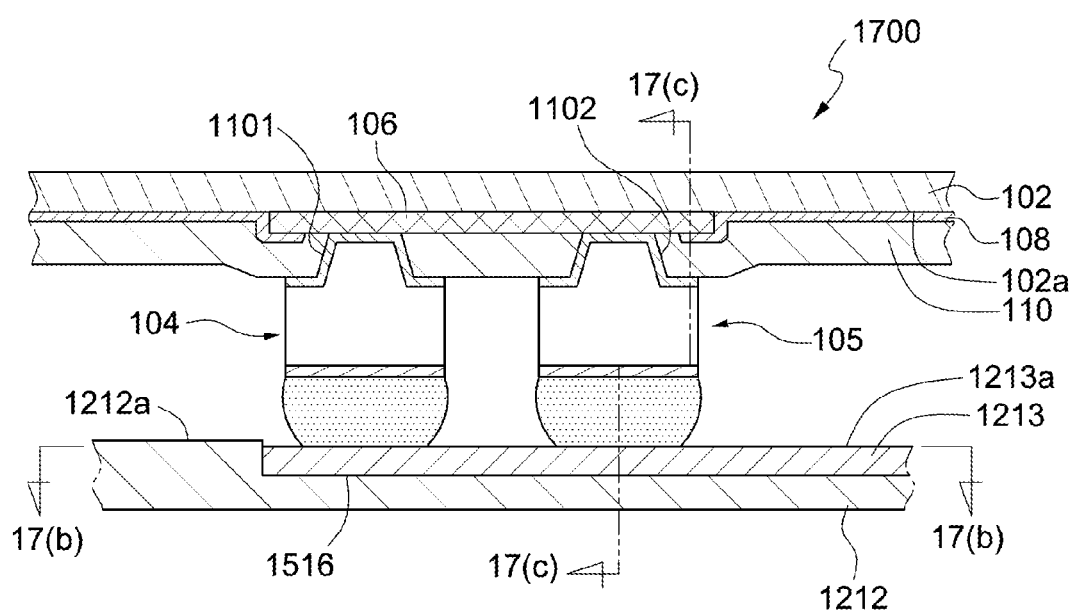
FIG. 17(a) illustrates a cross-sectional view of a semiconductor package according to another embodiment of the present disclosure.

FIG. 17(a) illustrates a cross-sectional view of a semiconductor package 1700 according to another embodiment of the present disclosure. The semiconductor package 1700 of this embodiment is similar to the semiconductor package 1600 illustrated in FIG. 16(a), except that the second insulation layer 110 has two or more openings 1101, 1102 corresponding to a respective bonding pad 106. Each opening 1101, 1102 exposes a portion of the respective bonding pad 106. The two pillar structures 104, 105 are disposed in the respective openings 1101, 1102 on a portion of the bonding pad 106 exposed by a respective opening 1101, 1102. A portion of each of the two pillar structures 104, 105 extends beyond the respective opening 1101, 1102 and is disposed on a surface of the second insulation layer 110.

Figure 17B:
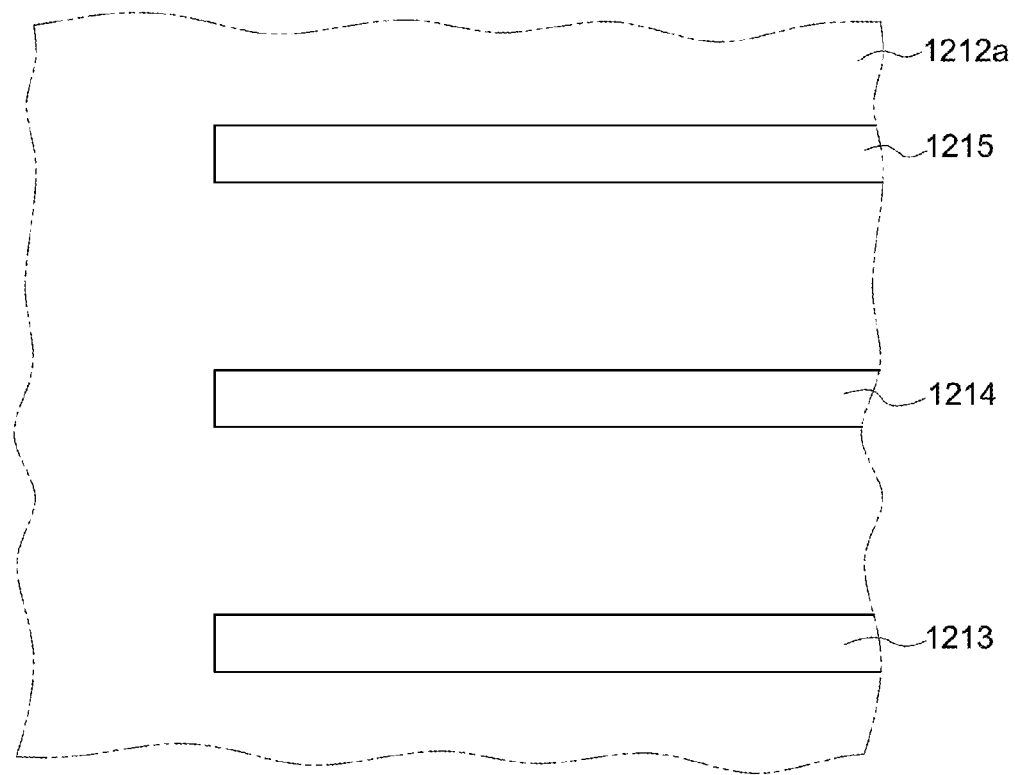
FIG. 17(b) illustrates a bottom view taken along line 17(b)-17(b) of the semiconductor package in FIG. 17(a).

FIG. 17(b) illustrates a bottom view taken along line 17(b)-17(b) of the semiconductor package 1700 in FIG. 17(a). In this embodiment, each of the first trace 1213 and a third trace 1215 has at least two pillar structures disposed thereon. In this embodiment, each of the first trace 1213, a second trace 1214, and the third trace 1215 has a consistent width.

Figure 17C:
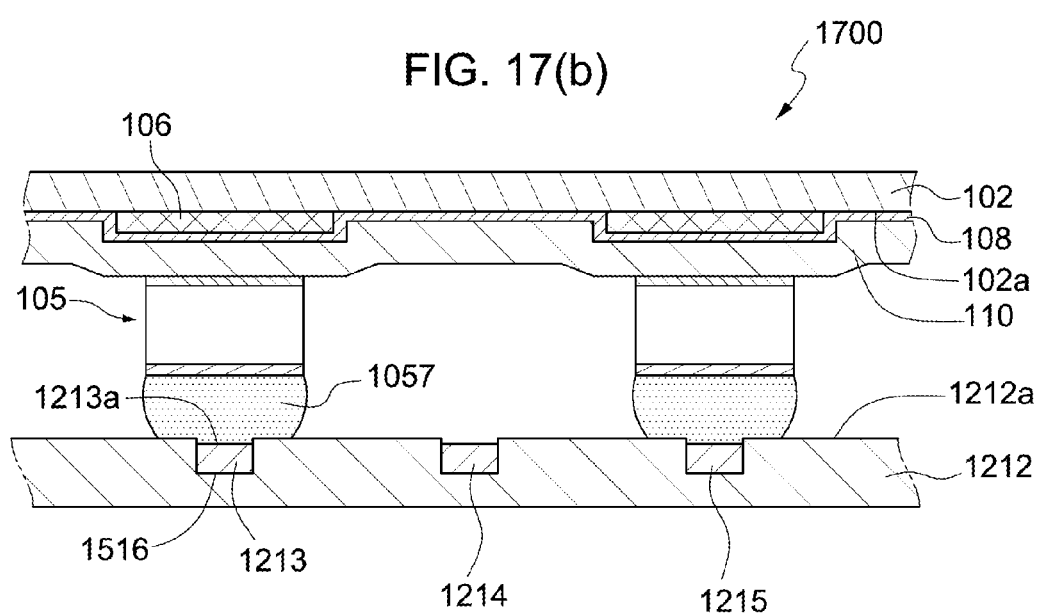
FIG. 17(c) illustrates a cross-sectional view taken along line 17(c)-17(c) of the semiconductor package in FIG. 17(a).

FIG. 17(c) illustrates a cross-sectional view taken along line 17(c)-17(c) of the semiconductor package 1700 in FIG. 17(a). Each of the first trace 1213, the second trace 1214, and the third trace 1215 are embedded in the substrate 1212. That is, the top surface 1213a of the first trace 1213, a top surface of the second trace 1214, and a top surface of the third trace 1215 are below the first surface 1212a of the substrate 1212.

Figure 18A:
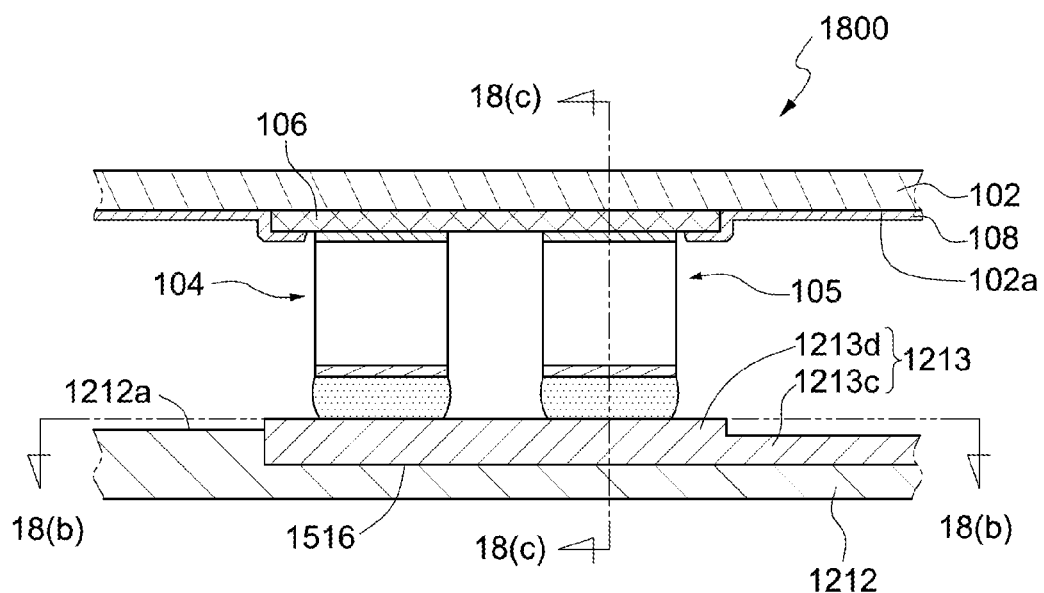
FIG. 18(a) illustrates a cross-sectional view of a semiconductor package according to another embodiment of the present disclosure.
Figure 18B:
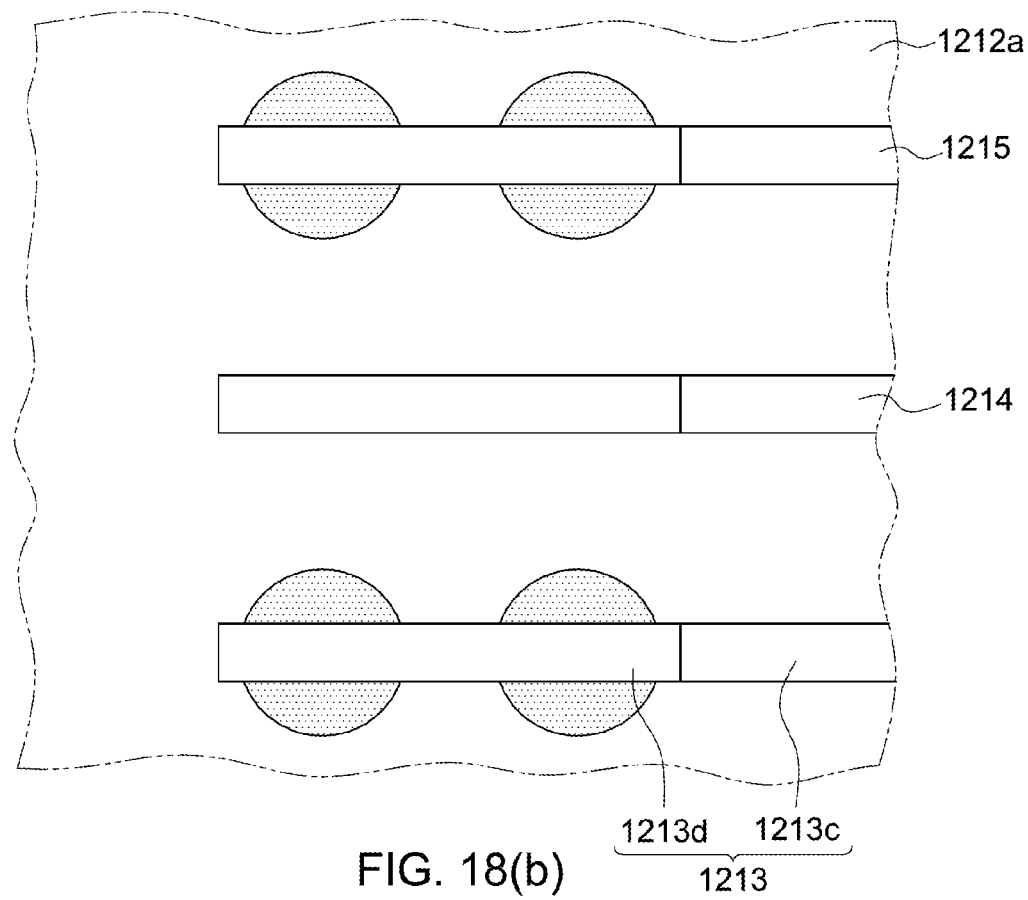
FIG. 18(b) illustrates a bottom view taken along line 18(b)-18(b) of the semiconductor package in FIG. 18(a).

FIG. 18(a) illustrates a cross-sectional view of a semiconductor package 1800 according to another embodiment of the present disclosure. The semiconductor package 1800 of this embodiment is similar to the semiconductor package 1500 illustrated in FIG. 15(a), except that the first trace 1213 comprises a main portion 1213c and a protrusion portion 1213d. The protrusion portion 1213d is disposed on the main portion 1213c, and protrudes from the first surface 1212a of the substrate 1212. The position of the protrusion portion 1213d corresponds to a position of the two pillar structures 104, 105. The solder layer 1047, 1057 when heated would flow along a side surface of the protrusion portion 1213d of the first trace 1213. FIG. 18(b) illustrates a bottom view taken along line 18(b)-18(b) of the semiconductor package 1800 in FIG. 18(a). In this embodiment, each of the first trace 1213, a second trace 1214, and a third trace 1215 has a consistent width.

Figure 18C:
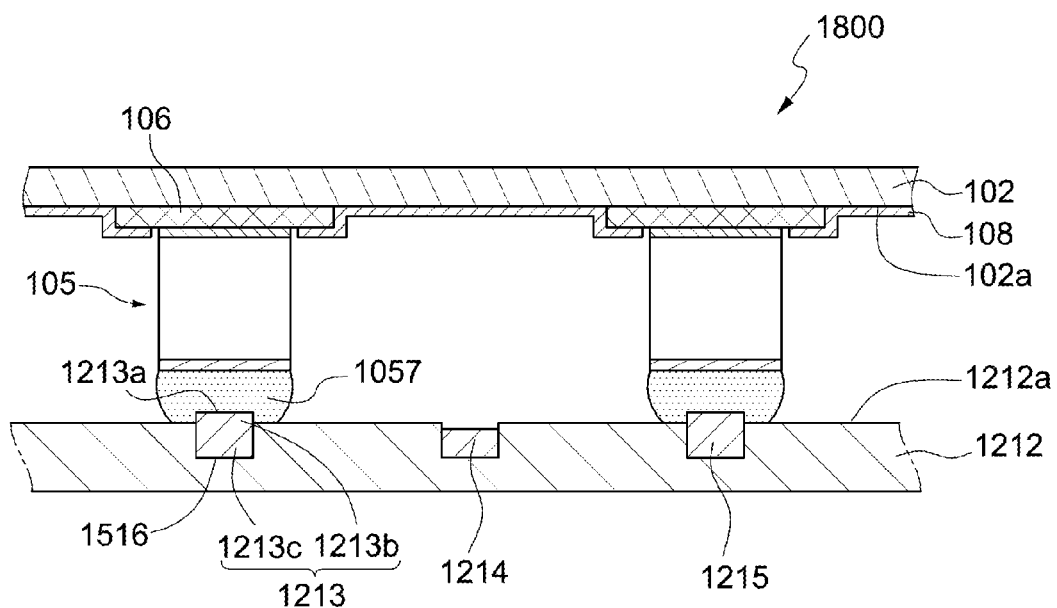
FIG. 18(c) illustrates a cross-sectional view taken along line 18(c)-18(c) of the semiconductor package in FIG. 18(a).

FIG. 18(c) illustrates a cross-sectional view taken along line 18(c)-18(c) of the semiconductor package 1800 in FIG. 18(a). As can be seen in FIG. 18(c), widths of the main portion 1213c and the protrusion portion 1213d are substantially the same. In this embodiment, the main portion 1213c and the protrusion portion 1213d are formed integrally. In other embodiments, the protrusion portion 1213d is plated on the main portion 1213c. At least a portion of the first trace 1213 and the third trace 1215 protrude from the first surface 1212a of the substrate 1212; that is, a top surface 1213a of the protrusion portion 1213d of the first trace 1213 and a top surface of a protrusion portion of the third trace 1215 are above the first surface 1212a of the substrate 1212. The second trace 1214 is recessed from the first surface 1212a of the substrate 1212; that is, the top surface of the second trace 1214 is below the first surface 1212a of the substrate 1212.

Figure 19A:
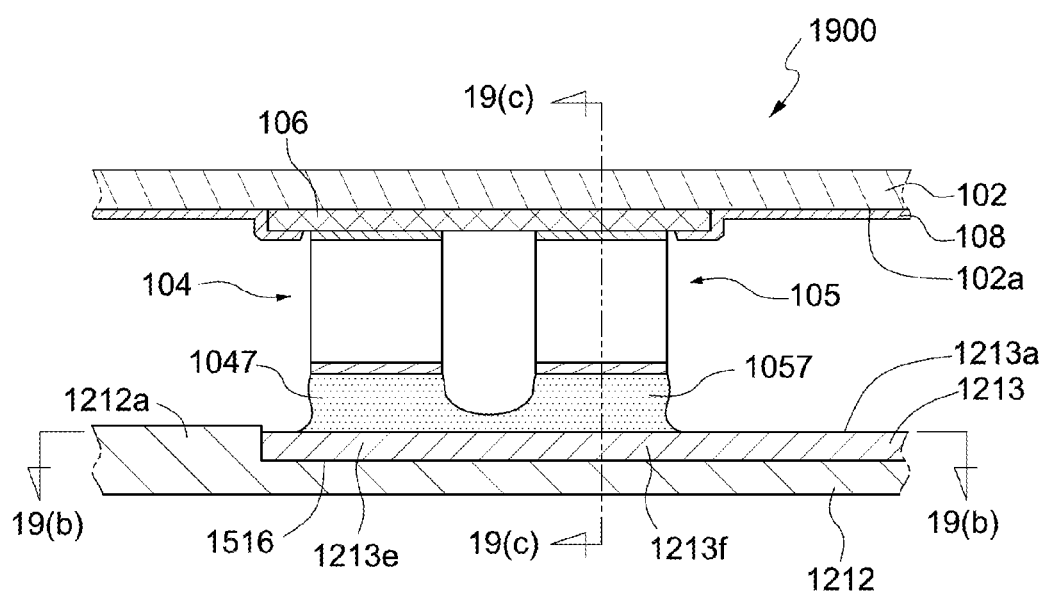
FIG. 19(a) illustrates a cross-sectional view of a semiconductor package according to another embodiment of the present disclosure.

FIG. 19(a) illustrates a cross-sectional view of a semiconductor package 1900 according to another embodiment of the present disclosure. The semiconductor package 1900 of this embodiment is similar to the semiconductor package 1500 illustrated in FIGS. 15(a)-15(c), except for the configurations of the traces 1213, 1214, 1215 of the substrate 1212.

In this embodiment, the first trace 1213 has two bonding portions 1213e, 1213f. Each of the two bonding portions 1213e, 1213f corresponds to the respective two pillar structures 104, 105, and the two pillar structures 104, 105 are bonded to the two bonding portions 1213e, 1213f through the two solder layers 1047, 1057, respectively. As such, when the solder layers 1047, 1057 are molten and overflow (e.g., because of a reflow process or for other reasons), the bonding portions 1213e, 1213f can receive portions of the overflowing material of the solder layers 1047, 1057. Therefore, the solder layers 1047, 1057 will not contact an adjacent trace and cause a short circuit. In addition, in this embodiment, overflowing materials of the solder layers 1047, 1057 flow along the first trace 1213 and connect to each other. As such, a contact area between the solder layer 1047, 1057 and the first trace 1213 is enlarged.

Each of the second trace 1214 and the third trace 1215 may have structures (e.g., bonding portions 1213e, 1213f) similar to that of the first trace 1213. Each of the first trace 1213, the second trace 1214, and the third trace 1215 includes copper, or may also include another metal or metal alloy or other conductive materials.

Figure 19B:
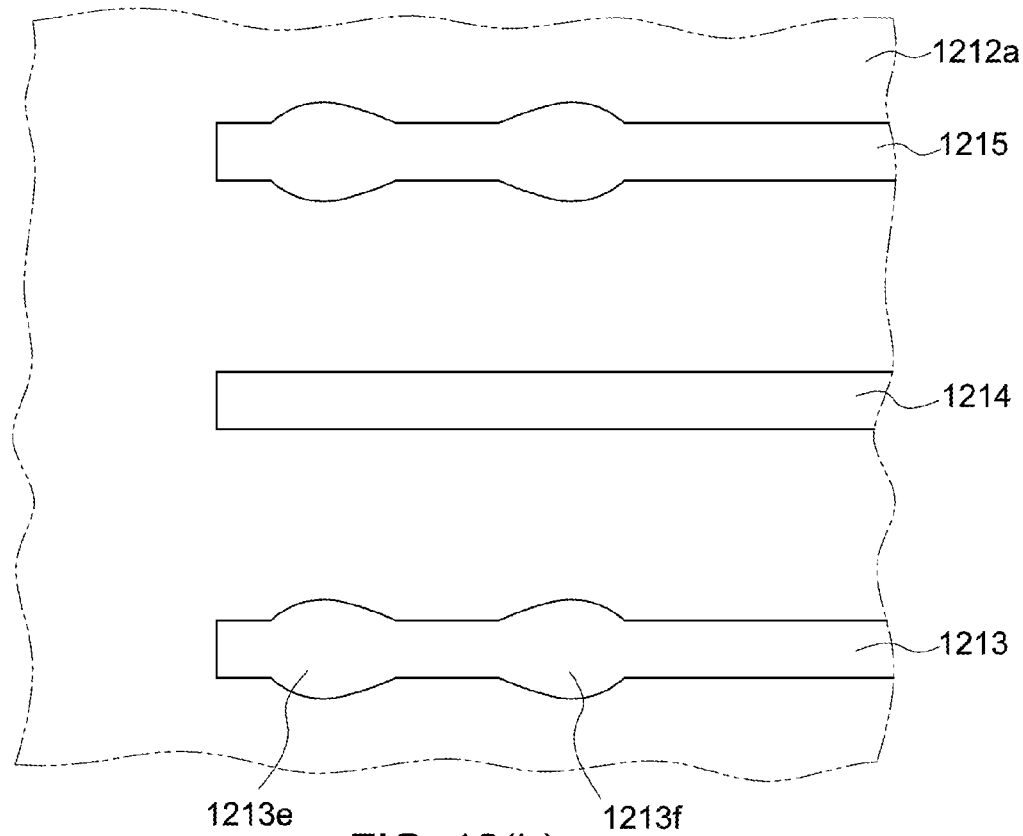
FIG. 19(b) illustrates a bottom view taken along line 19(b)-19(b) of the semiconductor package in FIG. 19(a).

FIG. 19(b) illustrates a bottom view taken along line 19(b)-19(b) of the semiconductor package 1900 in FIG. 19(a). In this embodiment, each of the first trace 1213 and the third trace 1215 has at least two pillar structures disposed thereon. In this embodiment, the first trace 1213 and the bonding portions 1213e, 1213f are formed integrally. That is, the first trace 1213 and the bonding portions 1213e, 1213f are formed at the same time (e.g., after an etching process). The bonding portions 1213e, 1213f expand from the side of the first trace 1213; thus, the width of the bonding portions 1213e, 1213f is greater than that of the first trace 1213. The shape of the bonding portions 1213e, 1213f is geometrically similar to the shape of corresponding pillar structures 104, 105; for example, the bonding portions 1213e, 1213f and the pillar structures 104, 105 can have matching or corresponding shapes, within manufacturing tolerances.

Figure 19C:
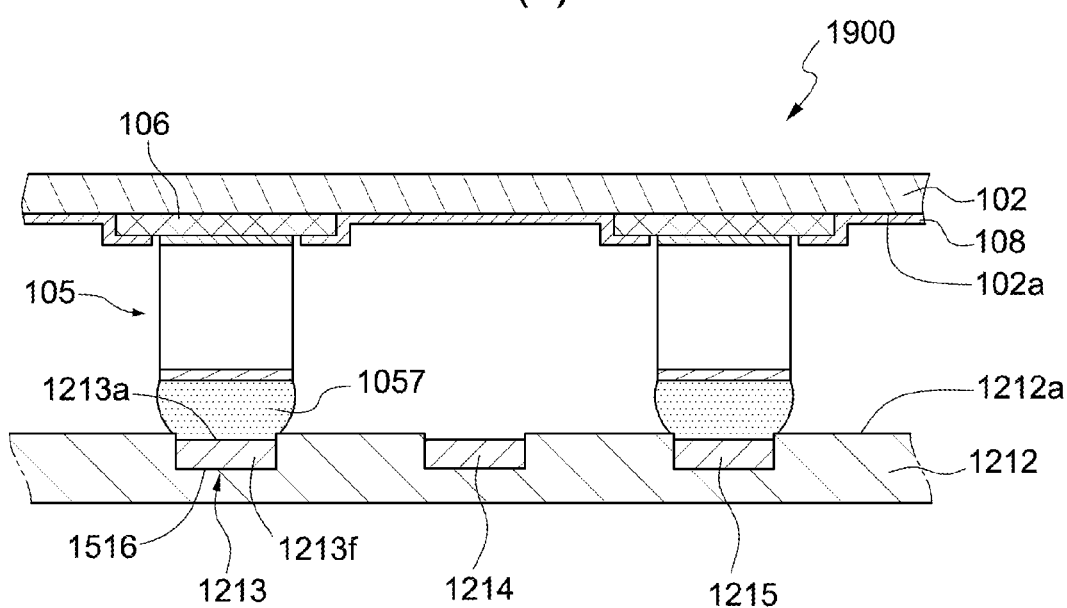
FIG. 19(c) illustrates a cross-sectional view taken along line 19(c)-19(c) of the semiconductor package in FIG. 19(a).

FIG. 19(c) illustrates a cross-sectional view taken along line 19(c)-19(c) of the semiconductor package 1900 in FIG. 19(a). In this embodiment, the first trace 1213, the second trace 1214, and the third trace 1215 are recessed from the first surface 1212a of the substrate 1212. In addition, a center axis of the bonding portions 1213e, 1213f is substantially aligned with a center axis of the corresponding pillar structures 104, 105, and an area of each of the bonding portions 1213e, 1213f is smaller than an area of a corresponding pillar structure 104, 105. Thus, the area of the bonding portions 1213e, 1213f is within the projection of the corresponding pillar structures 104, 105. In this embodiment, the ratio of the width of the pillar structure 105 to the width of the bonding portion 1213f is from about 1:1 to about 1.2:1.

Figure 20A:
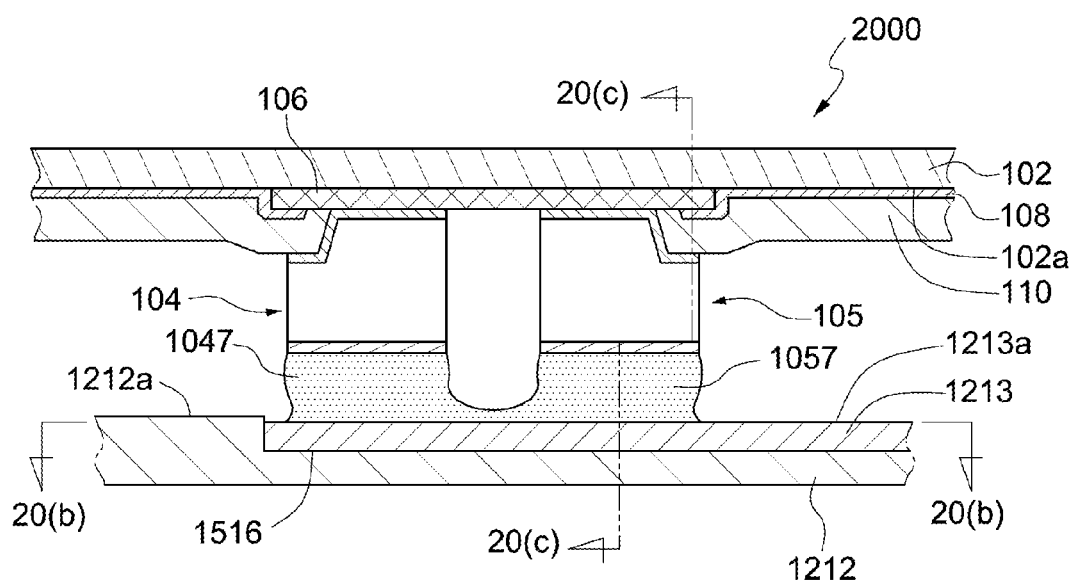
FIG. 20(a) illustrates a cross-sectional view of a semiconductor package according to another embodiment of the present disclosure.

FIG. 20(a) illustrates a cross-sectional view of a semiconductor package 2000 according to another embodiment of the present disclosure. The semiconductor package of this embodiment is similar to the semiconductor package 1900 illustrated in FIG. 19(a), except that a second insulation layer 110 covers the first insulation layer 108 and a portion of each of the bonding pads 106. The second insulation layer 110 has at least one opening 110c. Each opening 110c corresponds to a respective bonding pad 106 and exposes a portion of a bonding pad 106.

Figure 20B:
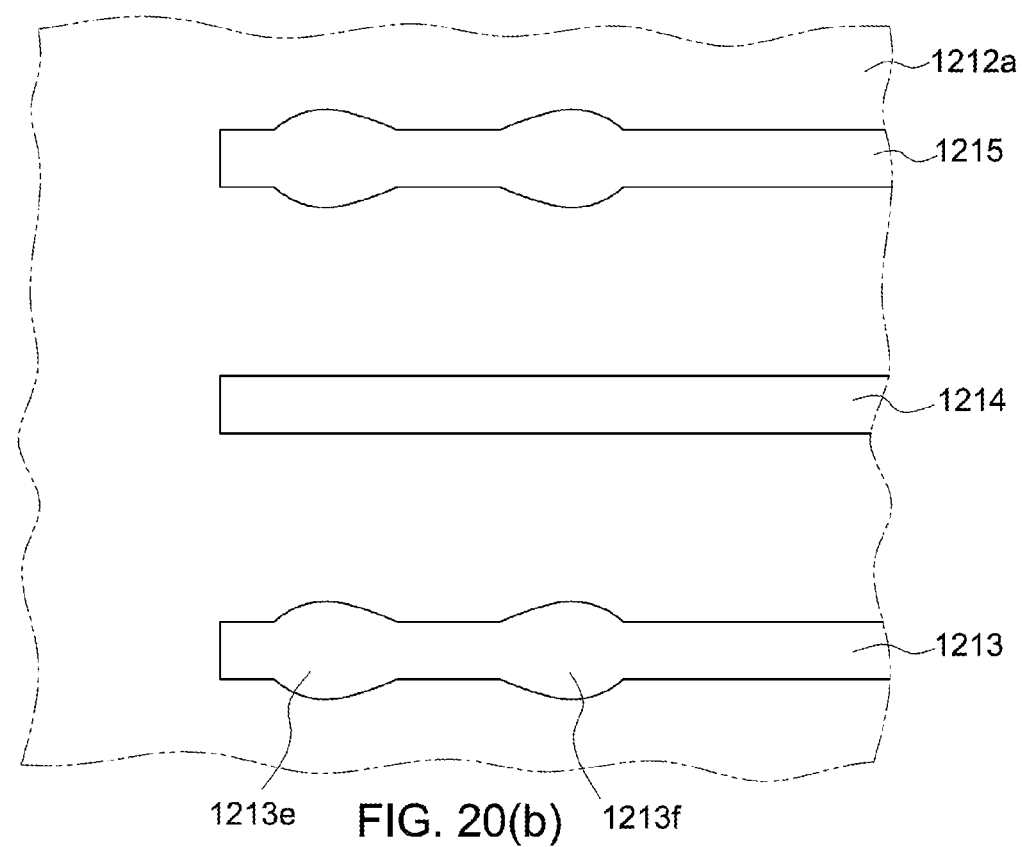
FIG. 20(b) illustrates a bottom view taken along line 20(b)-20(b) of the semiconductor package in FIG. 20(a).

FIG. 20(b) illustrates a bottom view taken along line 20(b)-20(b) of the semiconductor package 2000 in FIG. 20(a). In this embodiment, each of the first trace 1213 and a third trace 1215 has at least two pillar structures disposed thereon, and the shape of the first trace 1213, a second trace 1214 and the third trace 1215 are the same as the first trace 1213, the second trace 1214 and the third trace 1215 illustrated in FIG. 19(b).

Figure 20C:
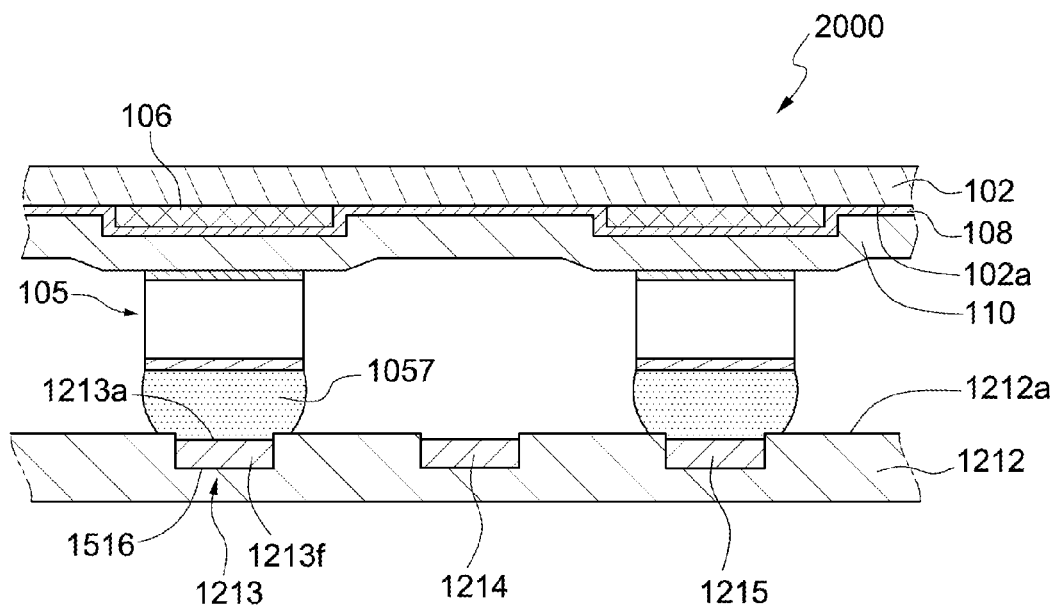
FIG. 20(c) illustrates a cross-sectional view taken along line 20(c)-20(c) of the semiconductor package in FIG. 20(a).

FIG. 20(c) illustrates a cross-sectional view taken along line 20(c)-20(c) of the semiconductor package 2000 in FIG. 20(a). Each of the first trace 1213, the second trace 1214, and the third trace 1215 are embedded in the substrate 1212. That is, a top surface 1213a of the first trace 1213, a top surface of the second trace 1214, and a top surface of the third trace 1215 are below the first surface 1212a of the substrate 1212.

Figure 21A:
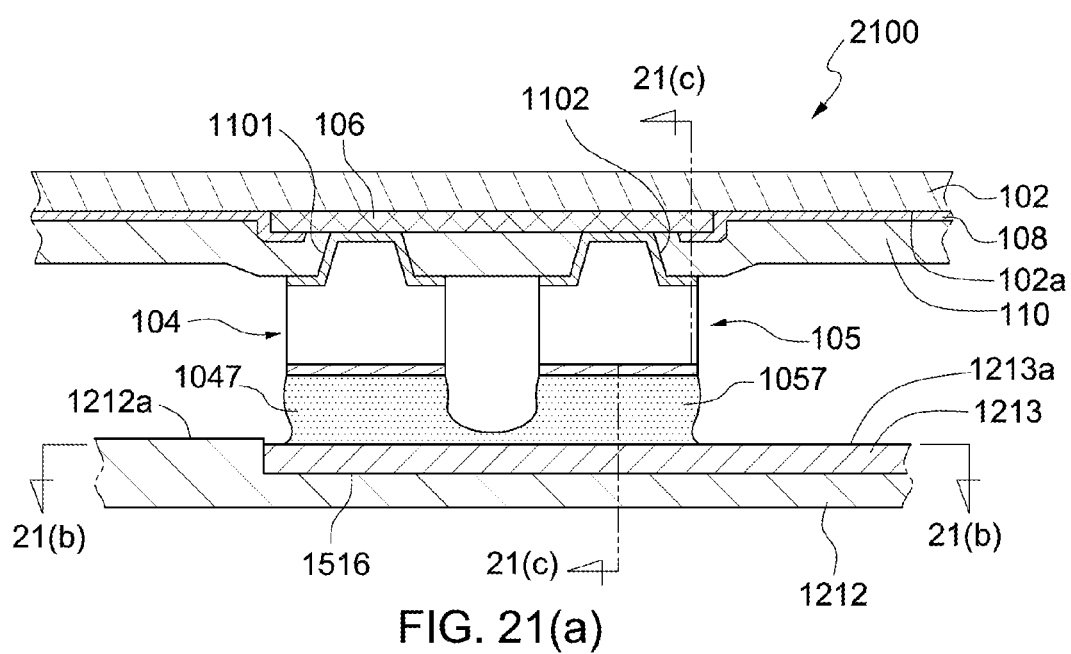
FIG. 21(a) illustrates a cross-sectional view of a semiconductor package according to another embodiment of the present disclosure.

FIG. 21(a) illustrates a cross-sectional view of a semiconductor package 2100 according to another embodiment of the present disclosure. The semiconductor package 2100 of this embodiment is similar to the semiconductor package 1900 illustrated in FIG. 19(a), except that the second insulation layer 110 has two or more openings 1101, 1102 corresponding to a respective bonding pad 106. Each opening 1101, 1102 exposes a portion of the bonding pad 106. The two pillar structures 104, 105 are disposed in the respective openings 1101, 1102 on a respective portion of the bonding pad 106 exposed by the respective opening 1101, 1102. A portion of each of the two pillar structures 104, 105 extends beyond the respective opening 1101, 1102 and extends on the surface 110a of the second insulation layer 110.

Figure 21B:
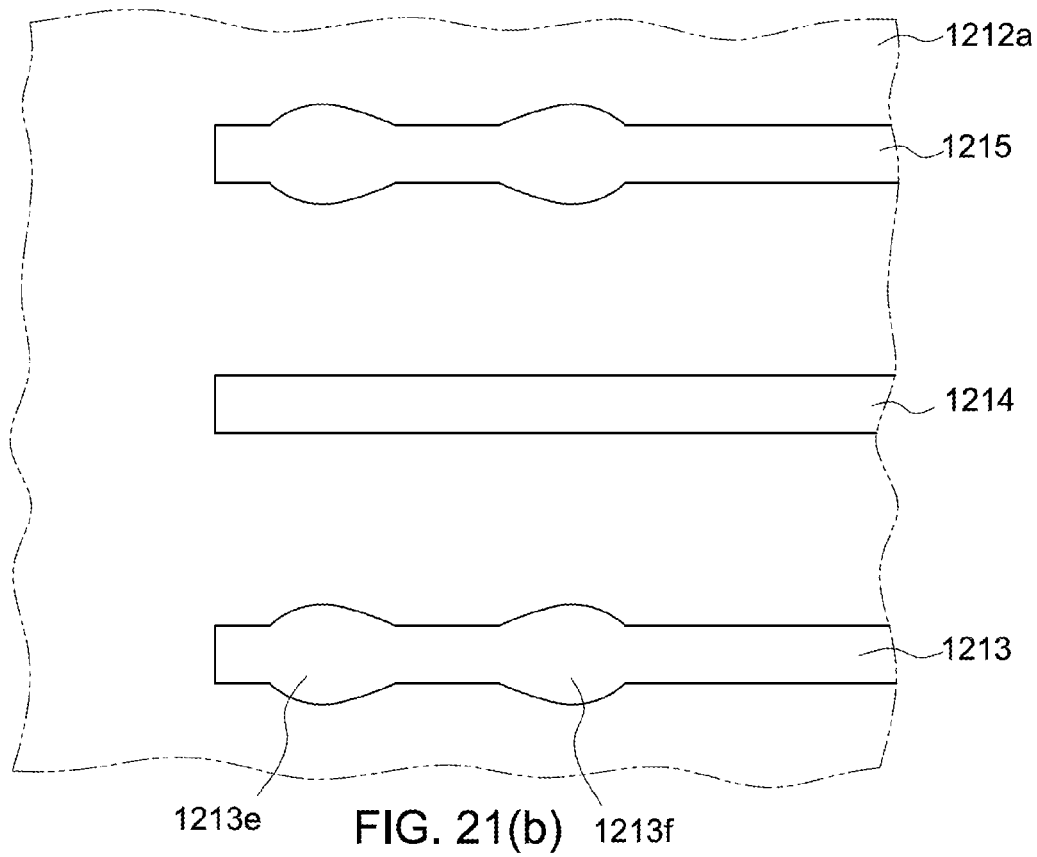
FIG. 21(b) illustrates a bottom view taken along line 21(b)-21(b) of the semiconductor package in FIG. 21(a).

FIG. 21(b) illustrates a bottom view taken along line 21(b)-21(b) of the semiconductor package 2100 in FIG. 21(a). In this embodiment, each of the first trace 1213 and a third trace 1215 has at least two pillar structures 104, 105 disposed thereon, and the shape of the first trace 1213, a second trace 1214 and the third trace 1215 are the same as the first trace 1213, the second trace 1214 and the third trace 1215 illustrated in FIG. 19(b).

Figure 21C:
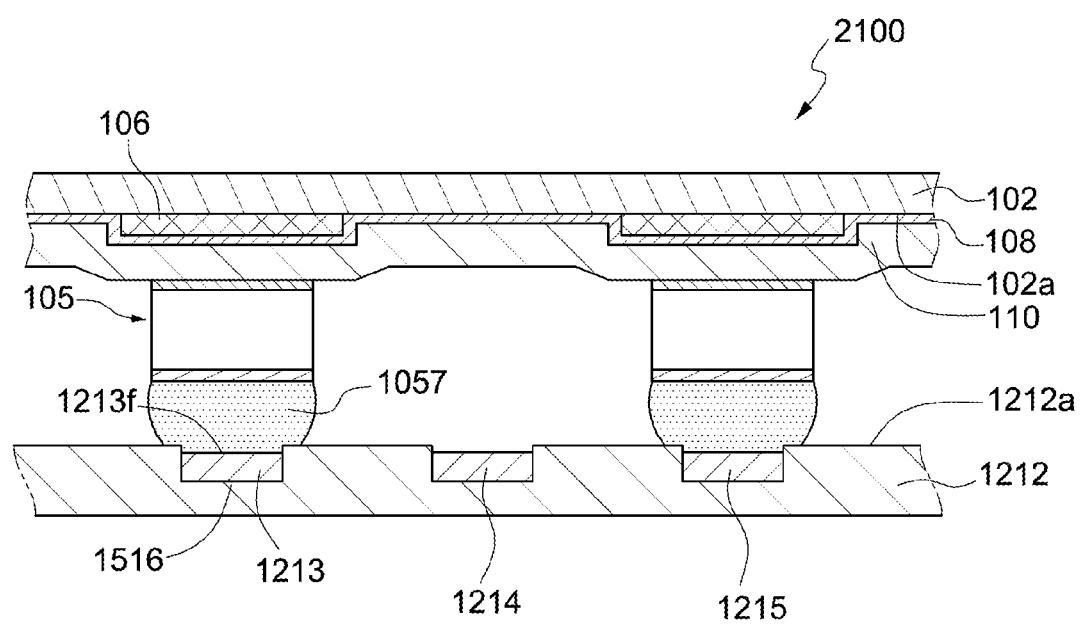
FIG. 21(c) illustrates a cross-sectional view taken along line 21(c)-21(c) of the semiconductor package in FIG. 21(a).

FIG. 21(c) illustrates a cross-sectional view taken along line 21(c)-21(c) of the semiconductor package 2100 in FIG. 21(a). Each of the first trace 1213, the second trace 1214, and the third trace 1215 are embedded in the substrate 1212. That is, the top surface 1213a of the first trace 1213, a top surface of the second trace 1214, and a top surface of the third trace 1215 are below the first surface 1212a of the substrate 1212.

As used herein and not otherwise defined, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, two values, such as characterizing a size in terms of a width or a height, can be substantially the same or matching if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, two lines or planes, such as characterizing two axes, can be substantially aligned if a displacement between the two is no greater than 5 μm, no greater than 1 μm, or no greater than 0.5 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
   a semiconductor element, the semiconductor element comprising at least one bonding pad disposed adjacent to a surface of the semiconductor element;
   two pillar structures disposed on a single bonding pad of the at least one bonding pad, wherein each of the pillar structures comprises an under bump metallization (UBM) layer; and
   an insulation layer disposed adjacent to the surface of the semiconductor element, wherein the insulation layer defines an opening, the opening exposing a portion of the single bonding pad, and the two pillar structures are disposed in the opening.

2. The semiconductor device of claim 1, wherein the two pillar structures are symmetrically disposed on the single bonding pad.

3. The semiconductor device of claim 1, wherein the two pillar structures are a left pillar structure and a right pillar structure, and wherein a distance D1 between a leftmost portion of the left pillar structure and a rightmost portion of the right pillar structure is greater than a width of the single bonding pad.

4. The semiconductor device of claim 1, wherein a portion of each of the pillar structures extends onto the insulation layer.

5. The semiconductor device of claim 1, wherein a shape of each of the pillar structures from a bottom view is a shape of one of a gibbous moon or a semiellipse.

6. The semiconductor device of claim 1, wherein a gap between the two pillar structures is about 10 µm to about 30 µm.

7. The semiconductor device of claim 1, wherein the semiconductor element comprises a chip, a package, an interposer, or a combination thereof.

8. A semiconductor package, comprising:
   a semiconductor element including a first surface and at least one bonding pad disposed adjacent to the first surface;
   two pillar structures electrically connected to a single bonding pad of the at least one bonding pad, wherein each of the pillar structures comprises an under bump metallization (UBM) layer;
   an insulation layer disposed adjacent to the first surface of the semiconductor element, wherein the insulation layer defines an opening to expose portions of the single bonding pad, and each of the two pillar structures is disposed in the opening; and
   a substrate including a second surface and at least one trace disposed adjacent to the second surface, wherein the two pillar structures are electrically connected to the trace.

9. The semiconductor package of claim 8, wherein a trace of the least one trace includes two bonding portions corresponding to the two pillar structures, and each of the two bonding portions and a corresponding one of the two pillar structures have matching shapes.

10. The semiconductor package of claim 9, wherein an area of one of the two bonding portions is smaller than an area of a corresponding one of the two pillar structures.

11. The semiconductor package of claim 9, wherein an area of one of the two bonding portions is within a projection of a corresponding one of the two pillar structures.

12. The semiconductor package of claim 9, wherein a center axis of one of the two bonding portions is substantially aligned with a center axis of a corresponding one of the two pillar structures.

13. The semiconductor package of claim 8, wherein the at least one trace is embedded in the substrate and recessed from the second surface of the substrate.

14. The semiconductor package of claim 8, wherein a first trace of the at least one trace includes two bonding portions, a width of each of the two bonding portions is greater than a width of a remaining portion of the first trace, and the two pillar structures are bonded to respective ones of the two bonding portions.

15. The semiconductor package of claim 8, wherein the semiconductor element comprises a chip, a package, an interposer, or a combination thereof.

16. A semiconductor package, comprising:
    an interposer including a first surface and at least one bonding pad disposed adjacent to the first surface;
    two pillar structures electrically connected to a single bonding pad of the at least one bonding pad, wherein each of the pillar structures comprises an under bump metallization (UBM) layer;
    an insulation layer disposed adjacent to the first surface of the semiconductor element, wherein the insulation layer defines an opening to expose portions of the single bonding pad, and each of the two pillar structures is disposed in the opening; and
    a substrate including a second surface and at least one trace disposed adjacent to the second surface, wherein the two pillar structures are electrically connected to the trace.

17. The semiconductor device of claim 16, wherein a portion of each of the pillar structures extends onto the insulation layer.

18. The semiconductor package of claim 16, wherein a trace of the least one trace includes two bonding portions corresponding to the two pillar structures, and each of the two bonding portions and a corresponding one of the two pillar structures have matching shapes.

19. The semiconductor package of claim 18, wherein an area of one of the two bonding portions is smaller than an area of a corresponding one of the two pillar structures.

20. The semiconductor package of claim 18, wherein an area of one of the two bonding portions is within a projection of a corresponding one of the two pillar structures.

21. The semiconductor device of claim 1, further comprising:
    a second insulation layer covering at least a portion of the insulation layer and at least a portion of the single bonding pad, wherein the UBM layers of the pillar structures are in contact with the second insulation layer and extend onto a surface of the second insulation layer.

* * * * *